(12) United States Patent
Landig et al.

(10) Patent No.: US 11,409,143 B1
(45) Date of Patent: Aug. 9, 2022

(54) MULTIPLE LAYERS BETWEEN ELECTRODES INCLUDING NANOVOIDED POLYMER

(71) Applicant: Facebook Technologies, LLC, Menlo Park, CA (US)

(72) Inventors: Renate Eva Klementine Landig, Seattle, WA (US); Kenneth Diest, Kirkland, WA (US); Andrew John Ouderkirk, Redmond, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 265 days.

(21) Appl. No.: 16/386,232

(22) Filed: Apr. 16, 2019

Related U.S. Application Data

(60) Provisional application No. 62/777,825, filed on Dec. 11, 2018.

(51) Int. Cl.

| | | |
|---|---|---|
| *G02F 1/065* | (2006.01) | |
| *G02F 1/00* | (2006.01) | |
| *G02F 1/225* | (2006.01) | |
| *G02F 1/061* | (2006.01) | |
| *G02B 1/04* | (2006.01) | |

(52) U.S. Cl.
CPC ............. *G02F 1/065* (2013.01); *G02B 1/04* (2013.01); *G02F 1/0018* (2013.01); *G02F 1/061* (2013.01); *G02F 1/225* (2013.01)

(58) Field of Classification Search
CPC ..................................................... G02F 1/0072
See application file for complete search history.

(56) References Cited

U.S. PATENT DOCUMENTS

| | | | |
|---|---|---|---|
| 3,215,583 A | 11/1965 | Holme | |
| 3,985,599 A | 10/1976 | LePoutre et al. | |
| 4,613,544 A | 9/1986 | Burleigh | |
| 5,095,515 A | 3/1992 | Seaver | |
| 6,420,441 B1 | 7/2002 | Mien et al. | |
| 6,488,721 B1 * | 12/2002 | Carlson ............. | H01M 10/0436 429/231.9 |

(Continued)

FOREIGN PATENT DOCUMENTS

| | | | | |
|---|---|---|---|---|
| CA | 2737458 A1 | * | 3/2010 | ......... H01L 41/0533 |
| EP | 0807459 A1 | | 11/1997 | |
| WO | 2011088161 A1 | | 7/2011 | |

OTHER PUBLICATIONS

Notice of Allowance received for U.S. Appl. No. 16/703,291 dated Jun. 3, 2021, 61 pages.

(Continued)

*Primary Examiner* — Christopher Stanford
(74) *Attorney, Agent, or Firm* — FisherBroyles, LLP

(57) ABSTRACT

In some examples, a device includes a multilayer structure, a first electrode, and a second electrode, where the multilayer structure is located at least in part between the first electrode and the second electrode, and the multilayer structure includes a nanovoided polymer layer, and a solid layer. The solid layer may include a non-nanovoided layer. The nanovoided polymer layer may be an electroactive layer. The device may further include a control circuit configured to apply an electrical potential between the first electrode and the second electrode, which may induce a mechanical deformation of the multilayer.

19 Claims, 14 Drawing Sheets

(56) References Cited

U.S. PATENT DOCUMENTS

| | | | |
|---|---|---|---|
| 6,628,850 | B1 | 9/2003 | Yao |
| 7,002,754 | B2 | 2/2006 | Baer et al. |
| 7,230,771 | B2 | 6/2007 | Kuiper et al. |
| 8,477,402 | B2 | 7/2013 | Duncan et al. |
| 8,564,181 | B2* | 10/2013 | Choi ................. H01L 41/193 310/800 |
| 8,848,280 | B2 | 9/2014 | Arsenault |
| 9,228,822 | B2 | 1/2016 | Majidi et al. |
| 9,820,481 | B2 | 11/2017 | Hani et al. |
| 9,923,180 | B2* | 3/2018 | Thomas-Alyea ... H01M 50/446 |
| 10,670,782 | B2 | 6/2020 | Arbabi et al. |
| 10,690,946 | B2 | 6/2020 | Wilson |
| 10,749,448 | B2 | 8/2020 | Lindsay et al. |
| 10,797,217 | B2* | 10/2020 | Hakkens ............. H01L 41/083 |
| 11,022,856 | B1 | 6/2021 | Ouderkirk et al. |
| 11,025,175 | B1 | 6/2021 | Landig et al. |
| 2002/0009251 | A1 | 1/2002 | Byrne |
| 2002/0135863 | A1 | 9/2002 | Fukshima et al. |
| 2002/0186928 | A1 | 12/2002 | Curtis |
| 2005/0007675 | A1 | 1/2005 | Matsumoto et al. |
| 2005/0196552 | A1 | 9/2005 | Lehmann et al. |
| 2006/0024976 | A1 | 2/2006 | Waldfried et al. |
| 2006/0028734 | A1 | 2/2006 | Kuiper et al. |
| 2007/0020404 | A1 | 1/2007 | Seiberle et al. |
| 2007/0205398 | A1* | 9/2007 | Smela ................. H01M 4/045 252/500 |
| 2007/0263963 | A1 | 11/2007 | Hughes et al. |
| 2008/0137031 | A1 | 6/2008 | Hillis et al. |
| 2008/0171431 | A1 | 7/2008 | Yu et al. |
| 2008/0197518 | A1 | 8/2008 | Aylward et al. |
| 2008/0224103 | A1 | 9/2008 | Arsenault et al. |
| 2009/0034051 | A1 | 2/2009 | Arsenault et al. |
| 2009/0296188 | A1 | 12/2009 | Jain et al. |
| 2010/0075056 | A1 | 3/2010 | Axisa et al. |
| 2011/0149410 | A1 | 6/2011 | Blum |
| 2011/0242638 | A1 | 10/2011 | Horning et al. |
| 2012/0019185 | A1 | 1/2012 | Guidarelli et al. |
| 2012/0029416 | A1 | 2/2012 | Parker et al. |
| 2012/0200931 | A1 | 8/2012 | Haag et al. |
| 2012/0211261 | A1* | 8/2012 | Aabloo .................. F03G 7/00 174/126.1 |
| 2012/0298200 | A1 | 11/2012 | Niggemann et al. |
| 2013/0176628 | A1* | 7/2013 | Batchko ............. G02B 26/005 359/665 |
| 2013/0202867 | A1 | 8/2013 | Coggio et al. |
| 2013/0222881 | A1 | 8/2013 | Aizenberg et al. |
| 2013/0279151 | A1 | 10/2013 | Ouderkirk et al. |
| 2013/0335807 | A1 | 12/2013 | Arsenault et al. |
| 2014/0133010 | A1 | 5/2014 | Han et al. |
| 2014/0204372 | A1 | 7/2014 | Pang et al. |
| 2014/0217539 | A1 | 8/2014 | Rantala |
| 2014/0234995 | A1 | 8/2014 | Li et al. |
| 2014/0266647 | A1 | 9/2014 | Visitacion et al. |
| 2014/0312737 | A1* | 10/2014 | Jenninger ............. H01L 41/083 310/319 |
| 2014/0323603 | A1 | 10/2014 | Kolb et al. |
| 2014/0326292 | A1 | 11/2014 | Yordem et al. |
| 2015/0109657 | A1 | 4/2015 | Baumberg et al. |
| 2015/0205126 | A1 | 7/2015 | Schowengerdt |
| 2015/0241698 | A1 | 8/2015 | Schowengerdt |
| 2015/0259493 | A1 | 9/2015 | Nederkoorn et al. |
| 2015/0315012 | A1 | 11/2015 | Wiersma et al. |
| 2016/0036353 | A1* | 2/2016 | Stasik .................. F03G 7/005 318/116 |
| 2016/0103341 | A1 | 4/2016 | Long |
| 2016/0187985 | A1* | 6/2016 | Lim ................... G06F 3/0412 345/173 |
| 2016/0283773 | A1 | 9/2016 | Popovich et al. |
| 2017/0023807 | A1 | 1/2017 | Chang-Hasnain et al. |
| 2017/0031078 | A1 | 2/2017 | Thompson et al. |
| 2017/0090570 | A1 | 3/2017 | Rain et al. |
| 2017/0192595 | A1 | 7/2017 | Choi et al. |
| 2017/0285348 | A1 | 10/2017 | Tyres et al. |
| 2017/0365630 | A1 | 12/2017 | Yang |
| 2018/0093456 | A1 | 4/2018 | Van Overmeere et al. |
| 2018/0164627 | A1 | 6/2018 | Oh |
| 2018/0356303 | A1 | 12/2018 | Li et al. |
| 2019/0296218 | A1 | 9/2019 | Ouderkirk et al. |
| 2019/0361318 | A1* | 11/2019 | Johnson ................ G02F 1/0128 |
| 2020/0076328 | A1 | 3/2020 | Cha et al. |
| 2020/0183168 | A1 | 6/2020 | Spann et al. |
| 2020/0183199 | A1 | 6/2020 | Diest et al. |
| 2020/0183200 | A1 | 6/2020 | Diest et al. |
| 2020/0185590 | A1 | 6/2020 | Malhotra et al. |

OTHER PUBLICATIONS

Final Office Action received for U.S. Appl. No. 16/262,433 dated May 25, 2021, 30 pages.
Wilson et al., "Variable Wave Plate via Tunable Form-Birefringent Structures", Journal of Microelectromechanical Systems, vol. 17, No. 4, Aug. 2008, pp. 1039-1046.
International Preliminary Report on Patentability received for PCT Application Serial No. PCT/US2019/064395 dated Jun. 24, 2021, 10 pages.
International Preliminary Report on Patentability received for PCT Application Serial No. PCT/US2019/064367 dated Jun. 24, 2021, 10 pages.
Notice of Allowance received for U.S. Appl. No. 16/364,977 dated Feb. 2, 2021, 40 pages.
Notice of Allowance received for U.S. Appl. No. 16/263,829 dated Feb. 4, 2021, 27 pages.
Notice of Allowance received for U.S. Appl. No. 16/449,964 dated Mar. 4, 2021, 21 pages.
First Action Interview received for U.S. Appl. No. 16/262,433 dated Mar. 1, 2021, 12 pages.
Correa D.M., et al., "Negative Sliff less Honeycombs for Recoverable Shock Isolation," Rapid Prototyping Journal, 2015, vol. 21 (2), pp. 702-713.
Shen J., et al., "Simple Cubic Three-Dimensional Auxetic Metamaterials," Physica Status Solidi (B), Jul. 17, 2014, vol. 251 (8), pp. 1515-1522.
Mullin et al., "Pattern Transformation Triggered by Deformation", Physical Review Letters, vol. 99, No. 8, 084301, Aug. 22, 2007, 4 pages.
Babaee et al., "3D Soft Metamaterials with Negative Poisson's Ratio", Advanced Materials, vol. 25, No. 36, Jul. 22, 2013, pp. 5044-5049.
Bertoldi et al., "Negative Poisson's Ratio Behavior Induced by an Elastic Instability", Advanced Materials, vol. 22, No. 3, Jan. 13, 2010, pp. 361-366.
Overvelde et al., "Relating pore shape to the non-linear response of periodic elastomeric structures", Journal of the Mechanics and Physics of Solids, vol. 64, Mar. 2014, pp. 351-366.
Ren et al., "Design and characterisation of a tuneable 3D buckling-induced auxetic metamaterial", Materials & Design, vol. 139, Feb. 5, 2018, pp. 336-342.
Correa et al., "Negative stiffness honeycombs for reoverable shock isolation", Rapid Prototyping Journal, vol. 21, No. 2, Mar. 16, 2015, pp. 193-200.
Coulais et al., "Discontinuous Buckling of Wide Beams and Metabeams", Physical Review Letters, vol. 115, No. 4, Jul. 21, 2015, 7 pages.
Bickel et al., "Design and Fabrication of Materials with Desired Deformation Behavior", ACM Transactions on Graphics, vol. 29, No. 4, Article 63, Jul. 1, 2010, pp. 1-10.
Rosset et al., "Small, fast, and tough: Shrinking down integrated elastomer transducers", Applied Physics Review, vol. 3, No. 3, Article 031105, Sep. 26, 2016, pp. 1-20.
Plante et al., "Large scale failure modes of dielectric elastomer actuators", International Journal of Solids and Structures, vol. 43, Mar. 29, 2006, pp. 7727-7751.
Optotune, "Electroactive Polymers", URL: https://optotune.com/technology/electroactive-polymers, retrieved on Apr. 30, 2020, 3 pages.
Novasentis, "Haptic Actuators", URL: https://novasentis.com/product, retrieved on Apr. 30, 2020, 4 pages.

(56) References Cited

OTHER PUBLICATIONS

Rosset et al., "Mechanical characterization of a dielectric elastomer microactuator with ion-implanted electrodes", Sensors and Actuators, A, vol. 144, No. 1, Jan. 14, 2008, pp. 185-193.
Gerratt et al., "Dielectric breakdown of PDMS thin films", Journal of Micromech and Microengineering, Technical Note, vol. 23, No. 6, Article 067001, Apr. 26, 2013, pp. 1-7.
Hunt et al., "A self-healing dielectric elastomer actuator", Applied Physics Letters, vol. 104, Article 113701, Mar. 19, 2014, pp. 1-3.
Skov et al., "Optimization Techniques for Improving the Performance of Silicone-Based Dielectric Elastomers", Advances Engineering Materials, vol. 20, No. 5, Article 1700762, Nov. 27, 2017, pp. 1-21.
Mazurek et al., "Glycerol as high-permittivity liquid filler in dielectric silicone elastomer", Journal of Applied Polymer Science, vol. 133, No. 43, Article 44153, Jul. 20, 2016, pp. 1-8.
Rao et al., "Synthesis of flexible silica aerogels using methyltrimethoxysilane (MTMS) precursor", Journal of Colloid and Interface Science, vol. 300, No. 1, Aug. 1, 2006, pp. 279-285.
Seo et al., "Reticulated Nanoporous Polymers by Controlled Polymerization-Induced Microphase Separation", Science, vol. 336, Jun. 15, 2012, pp. 1422-1425.
Jennings, S.G., "The Mean Free Path In Air", J. Aerosol Sci., vol. 19, No. 2, Apr. 2, 1988, pp. 159-166.
Gupta et al., "Nanoemulsions: Formation, Properties, and Applications", Soft Matter, vol. 12, No. 11, Feb. 23, 2016, pp. 1-17.
Helgeson et al., "Mesoporous organohydrogels from thermogelling photocrosslinkable nanoemulsions", Nature Materials, vol. 11, Feb. 12, 2012, pp. 1-9.
Guha et al., "Creating nanoscale emulsions using condensation", Nature Communications, vol. 8, Article 1371, Nov. 8, 2017, pp. 1-7.
Meier et al., "Microemulsion elastomers", Colloid and Polymer Science, vol. 274, Mar. 1, 1996, pp. 218-226.
Richter et al., "Design considerations of form birefringent microstructures", Applied Optics, vol. 34, No. 14, May 10, 1995, pp. 2421-2429.
Mahadik et al., "Elastic and Superhydrophobic Monolithic Methyltrimethoxysilane-based Silica Aerogels by Two-step Sol-gel Process", J Microelectron. and Packaging Soc., vol. 23, No. 1, Mar. 30, 2016, pp. 35-39.
Jeon et al., "Three dimensional nanoporous density graded materials formed by optical exposures through conformable phase masks", Applied Physics Letters, vol. 89, Article 253101, Dec. 18, 2006, pp. 1-3.
Sultan et al., "Electrical Breakdown Testing of Materials Intended for use in PV Modules", 3rd Atlas/NIST Workshop an Photovoltaics, Dec. 8-9, 2015, 29 pages.
Sekitani et al., "Stretchable active-matrix organic light-emitting diode display using printable elastic conductors", Nature Materials, vol. 8, May 10, 2009, pp. 494-499.
Someya et al., "Conformable, flexible, large-area networks of pressure and thermal sensors with organic transistor active matrixes", PNAS, vol. 102, No. 35, Aug. 30, 2005, pp. 12321-12325.
Wegener et al., "Controlled inflation of voids in cellular polymer ferroelectrets: Optimizing electromechanical transducer properties", Applies Physics Letters, vol. 84, No. 3, Jan. 19, 2004, pp. 392-394.
Wu et al., "Fabrication of ultralong perovskite structure nanotubes", RSC Advances, vol. 8, Jan. 2, 2018, pp. 367-373.
Wu et al., "Efficient multi-barrier thin film encapsulation of OLED using alternating Al2O3 and polymer layers", RSC Advances, vol. 8, Feb. 2, 2018, pp. 5721-5727.
Yang et al., "Harnessing Surface Wrinkle Patterns in Soft Matter", Advanced Functional Materials, vol. 20, Jul. 29, 2010, pp. 2550-2564.
Zhang et al., "Highly Porous Polyhedral Silsesquioxane Polymers. Synthesis and Characterization", J. Am. Chern. Soc , vol. 120, Aug. 11, 1998, pp. 8380-8391.
Yang et al., "Avoiding the pull-in instability of a dielectric elastomer film and the potential for increased actuation and anergy harvesting", Soft Matter, vol. 13, Jan. 6, 2017, pp. 4552-4558.
Wu et al., "3D Printed Silicones with Shape Memory", Scientific Reports, vol. 7, Article 4664, Jul. 5, 2017, pp. 1-6.
Jang et al., "Mechanically Tunable Three-Dimensional Elastomeric Network/Air Structures via Interference Lithography", Nano Letters, vol. 6, No. 4, Mar. 15, 2006, pp. 740-743.
Rogers et al., "Materials and Mechanics for Stretchable Electronics", Science, vol. 327, Mar. 26, 2010, pp. 1603-1607.
Wolak et al., "Dielectric response of structured multilayered polymer films fabricated by forced assembly", Applied Physics Letters, vol. 92, Article 113301, Mar. 17, 2008, pp. 1-3.
Mackey et al., "Enhanced breakdown strength of multilayered films fabricated by forced assembly microlayer coextrusion". Journal of Physics D: Applied Physics, vol. 42, Article 175304, Aug. 12, 2009, pp. 1-12.
Ieda, Masayuki, "Dielectric Breakdown Process of Polymers", IEEE Transactions on Electrical Insulation, vol. El-15, No. 3, Jun. 1980, pp. 206-224.
Matyka et al., "How to Calculate Tortuosity Easily", AIP Conference Proceedings, vol. 1453, May 14, 2012, 6 pages.
Fratzl et al., "The mechanics of tessellations—bioinspired strategies for fracture resistance", Chem Soc Rev., vol. 15, No. 2, Jan. 21, 2016, pp. 252-267.
Notice of Allowance received for U.S. Appl. No. 16/262,439 dated Apr. 6, 2021, 38 pages.
Notice of Allowance received for U.S. Appl. No. 16/351,477 dated Mar. 29, 2021, 28 pages.
Non-Final Office Action received for U.S. Appl. No. 16/351,477 dated Jun. 23, 2020, 27 pages.
Non-Final Office Action received for U.S. Appl. No. 16/364,977 dated Oct. 19, 2020, 38 pages.
Gohtani et al., "Nano-Emulsions; Emulsification Using Low Energy Methods", Japan Journal of Food Engineering, vol. 15, No. 3, Sep. 1, 2014, pp. 119-130.
Michler et al., "The physics and micro-mechanics of nano-voids and nano-particles in polymer combinations", ScienceDirect, Polymer, vol. 54, No. 13, Jun. 7, 2013, pp. 1-14.
Zhu et al., "Large deformation and electromechanical instability of a dielectric elastomer tube actuator", Journal of Applied Physics, vol. 108, Issue 7, Article 074113, Oct. 13, 2010, pp. 1-6.
Cameron et al., "Linear actuation in coextruded dielectric elastomer tubes", ScienceDirect, Sensors and Actuators A: Physical, vol. 147, Issue 1, Sep. 15, 2008, pp. 286-291.
Catmull et al., "Recursively generated B-spline surfaces on arbitrary topological meshes", Computer-Aided Design, vol. 10, No. 6, Nov. 1, 1978, pp. 183-188.
Loop, Charles Teorell, "Smooth Subdivision Surfaces Based on Triangles", Thesis, Master of Science, University of Utah, Aug. 1, 1987, 74 pages.
Merkel et al., "Gas Sorption, Diffusion, and Permeation in Poly(dimethylsiloxane)", Journal of Polymer Science: Part B: Polymer Physics, vol. 38, Feb. 1, 2000, pp. 415-434.
Kim et al., "Mathematical analysis of oxygen transfer through polydimethylsiloxane membrane between double layers of cell culture channel and gas chamber in microfluidic oxygenator", Microfluidics and Nanofluidics, vol. 15, Feb. 1, 2013, 39 pages.
Cruz-Hernandez et al., "Phase Control Approach to Hysteresis Reduction", IEEE Transactions on Control Systems Technology, vol. 9, No. 1, Jan. 1, 2001, pp. 17-26.
Zuev, Yu.S., "Elastomer-gas systems", International Polymer Science and Technology, vol. 28, No. 2, Feb. 1, 2001, pp. 43-53.
Shir, Daniel Jay-Lee et, "Three-Dimensional Nanofabrication with Elastomeric Phase Masks", PhD Thesis, University of Illinois at Urbana-Champaign, Oct. 17, 2007, 138 pages.
Moore, Duncan T., "Gradient Index Optics", Optical Elements, IVPV Handbook of Optics, 2nd Edition, vol. II—Devices, Measurements, and Properties, 1995, pp. 9.1-9.10.
Nguyen et al., "Synthesis, Processing, and Characterization of Inorganic-Organic Hybrid Cross-Linked Silica, Organic Polyimide,

(56) References Cited

OTHER PUBLICATIONS and Inorganic Aluminosilicate Aerogels", National Aeronautics and Space Administration STI Program, NASA/CR-2014-218328, Jul. 2014, 58 pages.
Shaiz, Narkis, "Gradient-Index Optics", Science Applications International Corp., Final Report, Mar. 31, 2010, 103 pages.
Teichman et al., "Gradient Index Optics at DARPA", Institute for Defense Analyses, IDA Document D-5027, Nov. 2013, 69 pages.
Tanaka et al., "Polymer Nanocomposites as Dielectrics and Electrical Insulation-perspectives for Processing Technologies, Material Characterization and Future Applications", IEEE Transactions on Dielectrics and Electrical Insulation, vol. 11, No. 5, Oct. 2004, pp. 763-784.
Cheng et al., "Controlled in Situ Nanocavitation in Polymeric Materials", Advanced Materials, vol. 23, Jan. 2011, pp. 409-413.
Solans et al., "Nano-emulsions: Formation by low-energy methods", Colloid & Interface Science, vol. 17, Issue 5, Oct. 2012, pp. 246-254.
Fuse et al., "Possible Mechanism of Superior Partial-Discharge Resistance of Polyamide Nanocomposites", Annual Report Conference on Electrical Insulation and Dielectric Phenomena, 2004, pp. 322-325.
Johnson et al., "A brief review of atomic layer deposition:from fundamentals to applications", Materials Today, vol. 17, No. 5, Jun. 2014, pp. 236-246.
Sole et al., "Nano-emulsions prepared by the phase inversion composition method: Preparation variables and scale up", Journal of Colloid and Interface Science, vol. 344, 2010, pp. 417-423.
Camino et al., "Polydimethylsiloxane thermal degradation Part 1. Kinetic aspects", Polymer, vol. 42, 2001, pp. 2395-2402.
Tanaka et al., "Proposal of a Multi-core Model for Polymer Nanocomposite Dielectrics", IEEE Transactions on Dielectrics and Electrical Insulation, vol. 12, No. 4, Aug. 2005, pp. 669-681.
Loiko et al., "Experimental results and theoretical model to describe angular dependence of light scattering by monolayer of nematic droplets", Journal of Quantitative Spectroscopy and Radiative Transfer, vol. 178, Jul. 2016, 11 pages.
Waldem et al., "Digilens Switchable Bragg grating waveguide optics for augmented reality applications", Proc. SPIE 10676, Digital optics for Immersive Displays, May 21, 2018, 1 page.
Diest et al., "Nanovoided Tunable Optics", U.S. Appl. No. 16/262,439, filed Jan. 30, 2019, 57 pages.
Ouderkirk et al., "Nanovoided Graded-Index Optical Elements, Optical Arrays, and Methods of Forming the Same", U.S. Appl. No. 16/426,737, filed May 30, 2019, 113 pages.
Diest et al., "Polymer Materials Including Coated Nanovoids and Methods and Systems for Forming the Same", U.S. Appl. No. 16/512,335, filed Jul. 15, 2019, 133 pages.
Sharma et al., "Switchable Electroactive Devices for Head-Mounted Displays", U.S. Appl. No. 16/351,477, filed Mar. 12, 2019, 108 pages.
Spann et al., "Nanovoided Polymers Having Shaped Voids", U.S. Appl. No. 16/703,674, filed Dec. 4, 2019, 149 pages.
Landig et al., "Planarization Layers for Nanovoided Polymers", U.S. Appl. No. 16/364,977, filed Mar. 26, 2019, 125 pages.
Ouderkirk et al., "Waveguide with Switchable Input", U.S. Appl. No. 16/263,829, filed Jan. 31, 2019, 55 pages.
Landig et al., "Nanovoided Polymers Using Phase Inversion", U.S. Appl. No. 16/449,964, filed Jun. 24, 2019, 139 pages.
Spann et al., "Reduced Hysteresis and Reduced Creep in Nanovoided Polymer Devices", U.S. Appl. No. 16/703,291, filed Dec. 4, 2019, 152 pages.
Diest et al., "Nanovoided Tunable Birefringence", U.S. Appl. No. 16/262,433, filed Jan. 30, 2019, 51 pages.
Malhotra et al., "Spatially Addressable Nanovoided Polymers", U.S. Appl. No. 16/417,911 filed May 21, 2019, 138 pages.
Landig et al., "Fabrication Of Shaped Voids", U.S. Appl. No. 16/669,970, filed Oct. 31, 2019, 110 pages.
International Search Report and Written Opinion received for PCT Application Serial No. PCT/US2019/064395 dated Mar. 12, 2020, 17 pages.
Si et al., "Liquid-Crystal-Enabled Active Plasmonics: A Review", Materials, vol. 7, No. 2, Feb. 18, 2014, pp. 1296-1317.
Crawford, Gregory P., "Electrically Switchable Bragg Gratings", Optics & Photonics News, Apr. 30, 2003, pp. 54-59.
Dickson et al., "Electronically Controlled Surface Plasmon Dispersion and Optical Transmission through Metallic Hole Arrays Using Liquid Crystal", NANO Letters, vol. 8, No. 1, Jan. 1, 2008, pp. 281-286.
International Search Report and Written Opinion received for PCT Application Serial No. PCT/US2019/064367 dated Mar. 11, 2020, 17 pages.
Preinterview first office action received for U.S. Appl. No. 16/262,433 dated Oct. 26, 2020, 58 pages.
Preinterview first office action received for U.S. Appl. No. 16/262,439 dated Nov. 30, 2020, 42 pages.
Final office action received for U.S. Appl. No. 16/351,477 dated Dec. 1, 2020, 38 pages.
Preinterview first office action received for U.S. Appl. No. 16/263,829 dated Dec. 22, 2020, 36 pages.
Non-Final office action received for U.S. Appl. No. 16/449,964 dated Nov. 24, 2020, 91 pages.
Holda et al., "Understanding and guiding the phase inversion process for synthesis of solvent resistant nanofiltration membranes", J. Appl. Polym. Sci. 42130, 2015, 17 pages.
Struzynska-Piron et al., "Synthesis of solvent stable polymeric membranes via UV depth-curing", Chem. Commun., vol. 49, 11494, 2013, 3 pages.

* cited by examiner

MULTIPLE LAYERS BETWEEN ELECTRODES INCLUDING NANOVOIDED POLYMER

CROSS REFERENCE TO RELATED APPLICATION

This application claims the benefit of U.S. Provisional Application No. 62/777,825, filed Dec. 11, 2018, the disclosure of which is incorporated, in its entirety, by this reference.

BACKGROUND

Polymer materials may be incorporated into a variety of different optic and electro-optic architectures, including active and passive optics and electroactive devices. Electroactive polymer (EAP) materials, for instance, may change their shape under the influence of an electric field. EAP materials have been investigated for use in various technologies, including actuation, sensing, and/or energy harvesting. Lightweight and conformable, electroactive polymers may be incorporated into wearable devices (such as haptic devices) and are attractive candidates for emerging technologies, including virtual reality/augmented reality devices where a comfortable, adjustable form factor is desired.

Virtual reality (VR) and augmented reality (AR) eyewear devices or headsets, for instance, may enable users to experience events, such as interactions with people in a computer-generated simulation of a three-dimensional world or viewing data superimposed on a real-world view. VR/AR eyewear devices and headsets may also be used for purposes other than recreation. For example, governments may use such devices for military training, medical professionals may use such devices to simulate surgery, and engineers may use such devices as design visualization aids.

These and other applications may leverage one or more characteristics of thin film polymer materials, including their electrical, mechanical, and/or optical properties. Notwithstanding recent developments, there is a need for improved actuators, sensors, and optical elements, along with associated methods, for example for applications in AR and VR devices.

SUMMARY

As will be described in greater detail below, examples of the instant disclosure include electroactive devices, such as actuators, sensors, and optical elements, having, for example, improved electrical and/or mechanical properties, such as improved electrical control of actuation and/or improved spatial resolution of sensing. In some examples, such a device may include a multilayer structure, a first electrode, and a second electrode, where the multilayer structure is located at least in part between the first electrode and the second electrode. The multilayer structure may include a nanovoided polymer layer and a solid layer. In this context, the solid layer may be a non-nanovoided layer, and in some examples may not include appreciable liquid or gas inclusions (e.g., in the form of droplets or bubbles). In some examples, the nanovoided polymer layer may represent an electroactive layer. The solid layer may include a polymer, and in some examples the nanovoided polymer layer and the solid layer may both include the same polymer. The solid layer may include a dielectric polymer. In some examples, the solid layer may include an inorganic layer, such as an inorganic compound (e.g., an inorganic oxide, nitride, carbide, or the like), or a metal. Example metals may include gold, silver, copper, aluminum, and the like. The solid layer and the nanovoided polymer layer may both comprise a fluoropolymer. The solid layer may have a dielectric breakdown voltage that is higher than that of the nanovoided polymer layer.

The device may be, or may include, an actuator, a sensor, a microphone, a speaker, or an electrically controllable optical element. The device may be configured so that a device parameter is controllable by an electrical signal applied between the first electrode and the second electrode. For example, the device parameter may include a flow rate of a fluid through the device, a layer thickness, a degree of actuation, a thermal conductivity, a dielectric breakdown strength, an acoustic absorption, a reflectivity, a transmission, a phase delay for electromagnetic radiation, a reflected beam direction, a focal length, an oscillation frequency, an absorption resonance frequency, a curvature, a vibrational resonance spectrum, or a vibrational amplitude.

In some examples, the device may be, or may include, a sensor. A sensor may be responsive to one or more sensed parameters, such as a mechanical input, an acoustic amplitude, a pressure, a temperature, a vibrational amplitude, or a position. The sensed parameter may be determined based on a measurable change in a physical parameter, such as an electrical parameter (e.g. resistance, capacitance, and/or inductance, and the like) determined between the first electrode and the second electrode, or between other electrodes. In some examples, the multilayer structure comprises a first layer, a second layer, and a third layer, where the second layer is located between the first layer and the third layer, and at least one layer is a nanovoided polymer layer. For example, the second layer may be a nanovoided polymer layer, and the first and third layers may both be solid polymer layers. In some examples, the second layer may be a solid polymer layer, and the first and third layers may both represent nanovoided polymer layers.

The above-described device may further include a control circuit configured to apply an electrical potential between the first electrode and the second electrode. Application of an electrical signal between the first electrode and the second electrode may induce a deformation of the nanovoided polymer element.

In some examples, a corresponding method may include depositing a nanovoided polymer layer onto a solid polymer layer using a deposition process (such as, e.g., spin coating, printing, chemical vapor deposition, vapor coating, transfer of a prefabricated nanovoided polymer layer, dipping, or spraying) or co-extruding the nanovoided polymer layer and the solid polymer layer to make the multilayer structure. This method may also include forming a first electrode and a second electrode on the multilayer structure so that at least part of the multilayer structure is located between the first electrode and the second electrode. Devices made using such processes are also disclosed.

Features from any of the embodiments described herein may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification.

Together with the following description, these drawings demonstrate and explain various principles of the present disclosure.

Figure 1A:
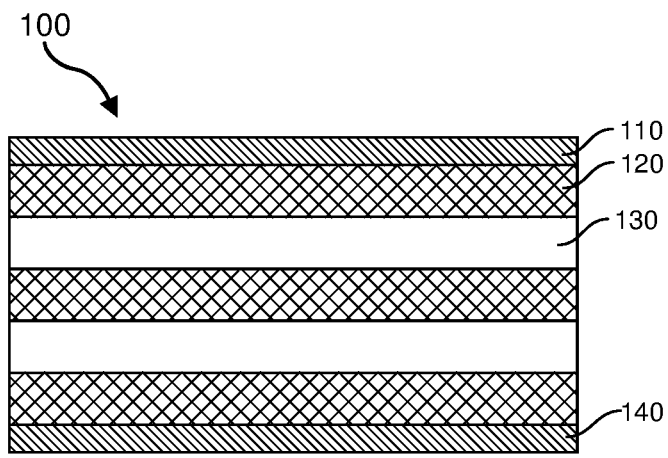
FIGS. 1A-1B depict example multilayer structures including a nanovoided polymer ("NVP") in accordance with some embodiments.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

The present disclosure is generally directed to multilayer structures (which may also be referred to as "multilayers") including, for example, at least one nanovoided polymer layer. As will be explained in greater detail below, embodiments of the instant disclosure may include a device that includes a multilayer (including a nanovoided polymer layer), a first electrode, and a second electrode. The multilayer may be located at least in part between the first electrode and the second electrode.

The following will provide, with reference to FIGS. 1-16, detailed descriptions of, for example, multilayer structures including an NVP (e.g., FIGS. 1-7), methods of fabricating a device (e.g., FIGS. 8-9), methods of actuation (e.g., FIG. 10), and example applications in augmented reality and/or virtual reality environments (e.g., FIGS. 11-16), in accordance with some embodiments.

Examples include nanovoided polymers in multilayer configurations. An example functional material includes a multilayer (e.g., a multilayer stack), where the multilayer includes at least two layers of material, where the first material has a first and second surface, and where the second material is applied to at least the first or the second surface of the first material. In some examples, the MLS contains at least one layer of nanovoided polymer. Other materials may include a polymer (e.g., a non-voided polymer), a metal (such as a transition metal or other metal such as aluminum), an inorganic material such as an oxide (e.g., a metal oxide or non-metal oxide such as silica), particles (such as microparticles, nanoparticles, or a solution or emulsion of nanoparticles), or the like.

A multilayer may have a first and second surface, where a first electrode is applied to the first surface and a second electrode is applied to the second surface. Electrodes may include a layer of electrically conducting material, such as a metal. The multilayer structure may have a thickness between approximately 200 nm and approximately 1 cm, for example between 2 microns and 1 mm. In addition, the multilayer structure may have layers having a predetermined thickness, and the thickness may change under actuation.

Figure 1B:
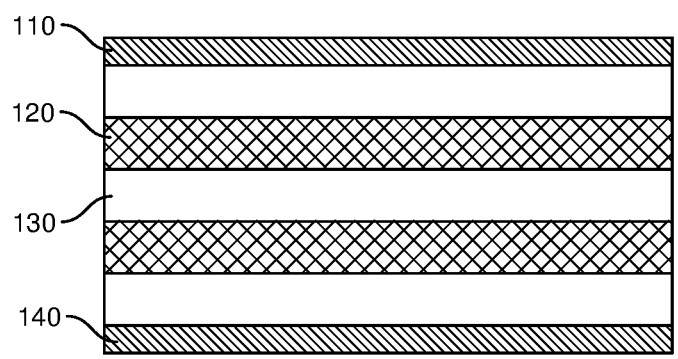

FIGS. 1A and 1B shows two possible arrangements of an electroactive device. FIG. 1A shows a device 100 including a first electrode 110 and a second electrode 140, and a multilayer including a solid layer 130 (e.g., comprising a bulk non-nanovoided polymer) and a nanovoided polymer (NVP) layer 120. In this example, the multilayer may include alternating NVP layers and solid layers, for example including two solid layers and three NVP layers in an alternating arrangement. In this example, there are five layers, though this is not limiting. For example, there may be two layers (e.g., one NVP layer and one solid layer), three layers (e.g., with a layer arrangement of NVP/solid/NVP or solid/NVP/solid), four layers, or any number of desired layers, for example between 2 and 10 layers, or more.

FIG. 1B shows an alternative arrangement of solid layers (130) and NVP layers (120) between first and second electrodes (110 and 140, respectively). In this configuration, there are three solid layers and two NVP layers in an alternating arrangement.

The layers of a multilayer structure may have approximately equal layer thicknesses, as shown. In some examples the layer thicknesses may be different for different layers. For example, a solid layer may have a layer thickness that is appreciably less than a layer thickness of an NVP layer.

Figure 2A:
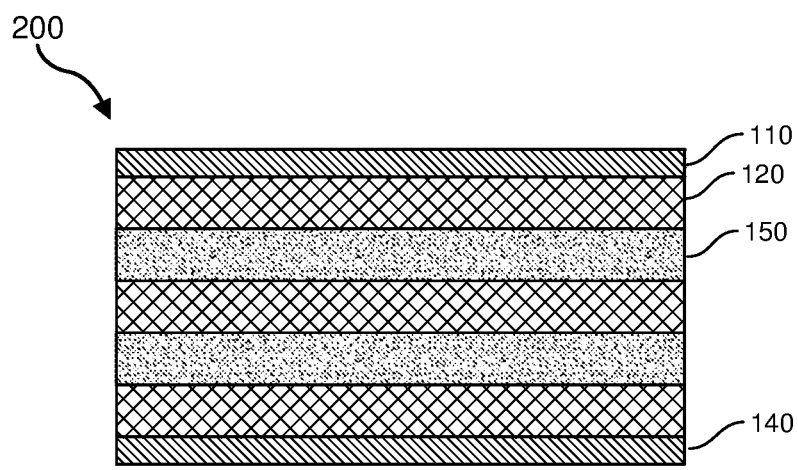
FIGS. 2A-2B depict example multilayer structures including an NVP layer and an inorganic layer in accordance with some embodiments.
Figure 2B:
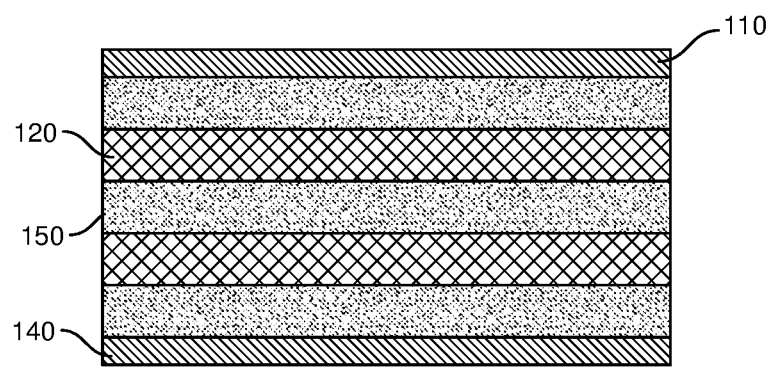

FIGS. 2A and 2B show variations of the design of the device of FIG. 1 having an alternating arrangement of NVP layers 120 and solid layers (in this example, inorganic insulating material layers) 150.

FIG. 2A shows an exemplary device 200 having an alternating arrangement of NVP layers (e.g., NVP layer 120) and solid layers (e.g., inorganic layer 150). In this example, there are three NVP layers and two solid layers (in this example, inorganic layers) 150.

FIG. 2B shows an alternative arrangement of solid layers (150) and NVP layers (120) between first and second electrodes (110 and 140, respectively). In this configuration, there are three solid layers and two NVP layers in an alternating arrangement.

Figure 3:
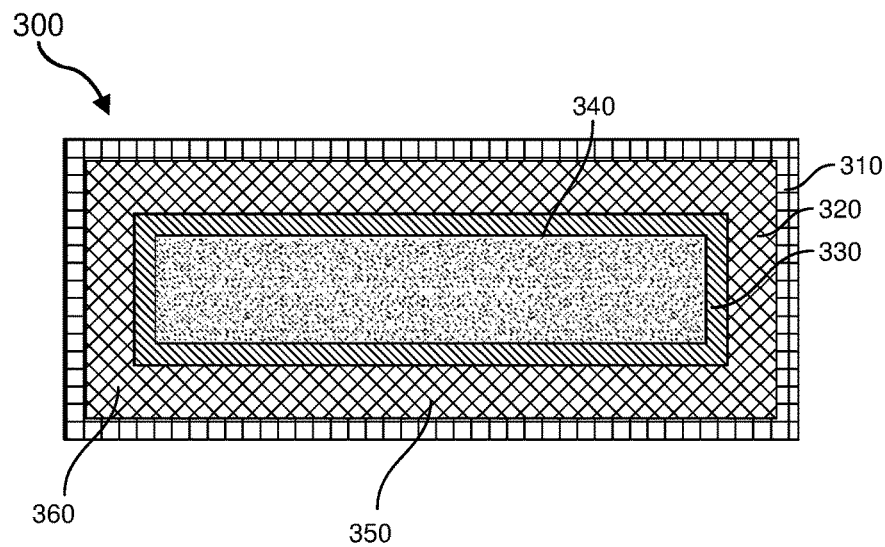
FIG. 3 depicts an example NVP layer forming part of a diffusion barrier in accordance with some embodiments.

FIG. 3 shows an NVP, for example as part of a diffusion barrier 300 (e.g., a protection layer for soaking up gases or moisture). The diffusion barrier 300 includes an outer solid layer 310 and inner solid layer 330 (e.g., including a polymer or an inorganic material such as an oxide or nitride), and an NVP layer 320 sandwiched in between the solid layers. In this example, the diffusion barrier acts as a protection layer encapsulating a sensitive material 340. The sensitive material may be any material sensitive to, for example, air, moisture, or other degradation agent.

The arrangement of FIG. 3 may also be considered as having a central portion 350 including a multilayer, located between edge portions (e.g., edge portion 360). The multilayer may be disposed, at least in part, between a pair of electrodes or other electrode arrangement (not shown in FIG. 3).

In some examples, a diffusion barrier may include a multilayer including one or more solid layers and one or more nanovoided polymer layers. A solid layer may act as a barrier to diffusion or other transportation of a degradation agent across the diffusion barrier. In some examples, a nanovoided polymer layer may provide additional protection for a sensitive material, for example by absorbing a degradation agent, or including a chemical or catalytic agent to assist elimination of the degradation agent.

Figure 4:
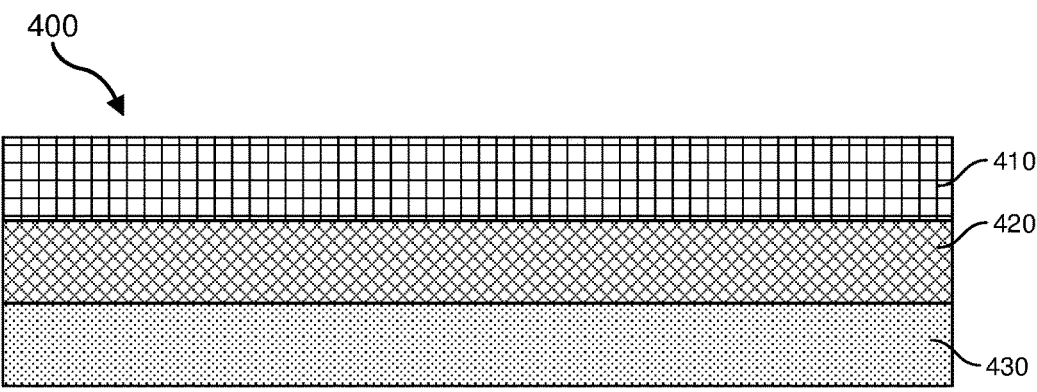
FIG. 4 depicts an example NVP intermediate layer used to join two otherwise incompatible materials in accordance with some embodiments.

FIG. 4 shows an example functional device 400, where an NVP is used as an intermediate layer (e.g., a hybrid layer) 420 between two materials 410 and 430 that may be incompatible with one another. Adhesion of two incompatible materials may be achieved using the intermediate layer 420. A method of bonding first and second incompatible materials may include depositing an NVP layer on the first material, and depositing the second material onto the NVP layer. In some examples, an NVP layer may be infused with a chemical and/or catalytic agent that facilitates adhesion to an adjacent substrate or layer.

Figure 5:
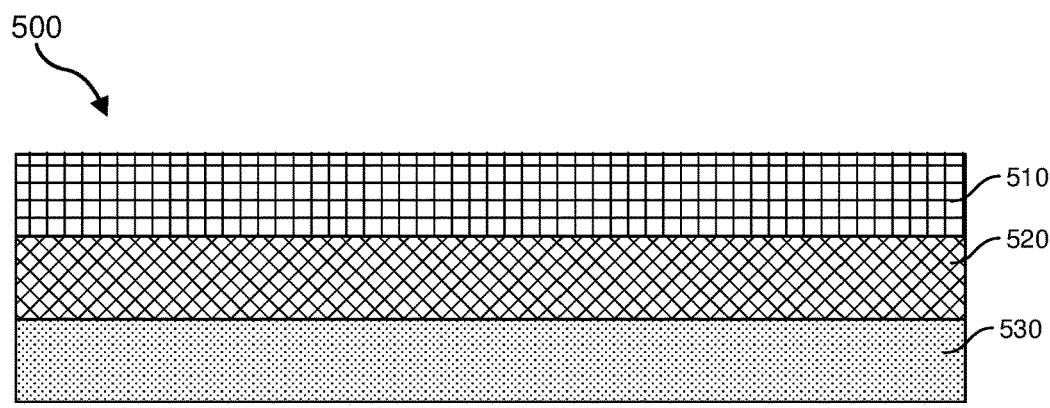
FIG. 5 depicts an example NVP used as a heat spreader, or heatsink, in accordance with some embodiments.

FIG. 5 illustrates an exemplary NVP used as a thermal insulator 500. Two thermal layers 510 and 530 may be thermally insulated from each other by applying an insulating spacer layer 520 (that includes an NVP) between them. In some examples, a similar device may be used as a heat spreader, for example, by passing a fluid (such as a gas or liquid) through an open-pore structure NVP.

Figure 6:
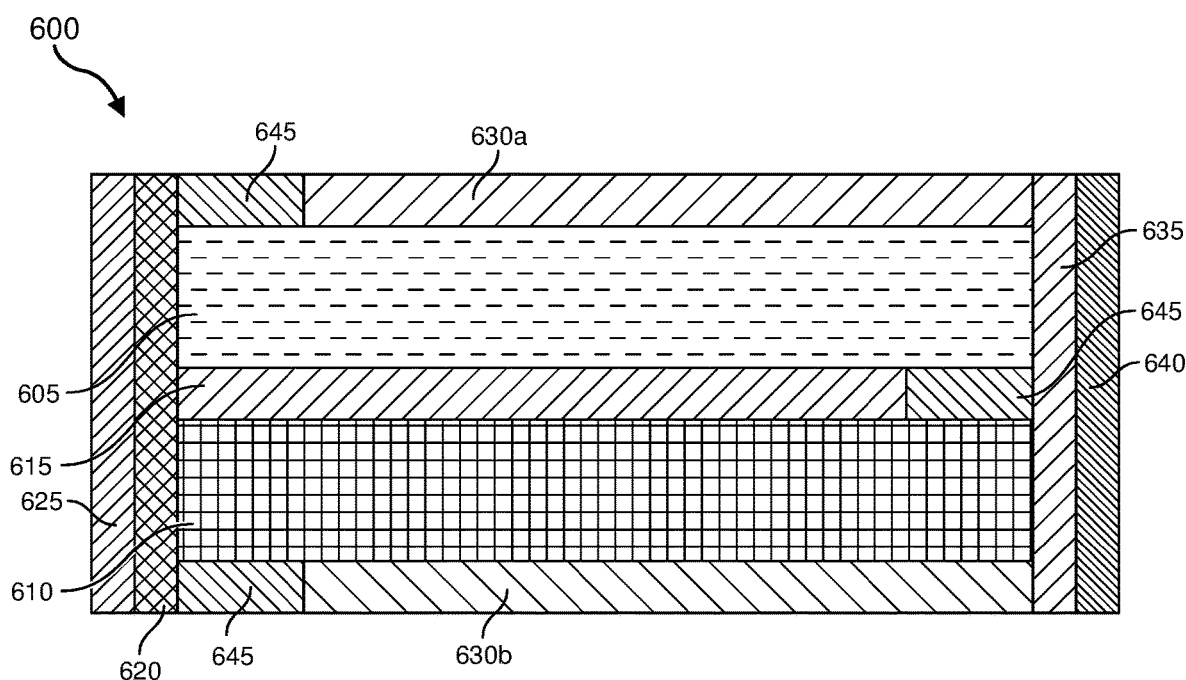
FIG. 6 shows an example electroactive device in which electroactive elements may be provided by multilayer structures.

FIG. 6 shows an exemplary actuator 600 that may include electroactive elements 605 and 610 and an electrode 615 (where the electrode 615 is optionally connected through a first flexible schoopage layer 620 to a first common electrode 625). Second electrodes (630a and 630b) may be connected through a second optional flexible schoopage layer 635 to a second common electrode 640. Electrodes may be isolated from each other, for example using an insulator such as insulator 645. The insulator 645 may include an electroactive polymer (EAP), or a dielectric material, such as a dielectric polymer, for example an acrylate polymer or silicone polymer.

The electrodes may have a different configuration than shown in FIG. 6. For example, the electrodes may have a sloped shape, or may have a more complex shape to allow for compression and expansion. In some examples, electrodes 630a, 630b, and 615 may be addressed separately. In some examples, schoopage layers may be omitted.

Multilayer structures, as described herein, may be used as one or both of the electroactive elements 605 and 610. The electroactive elements 605 and 610 may have the same structure, or may have a different structure from each other. For example, an electroactive element such as 605 or 610 may include a multilayer having at least one solid layer and at least one nanovoided polymer layer.

Figure 7A:
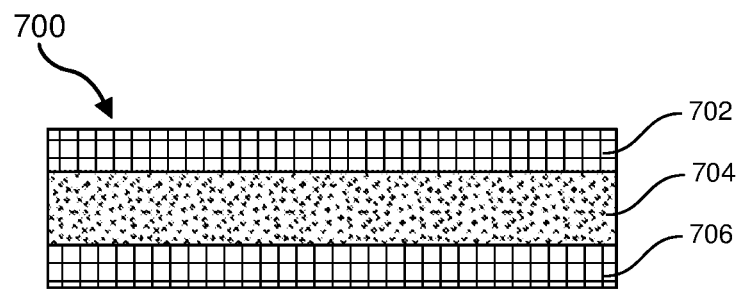
FIGS. 7A and 7B depict an example multilayer structure including an NVP layer that may be used in a MEMS device.
Figure 7B:
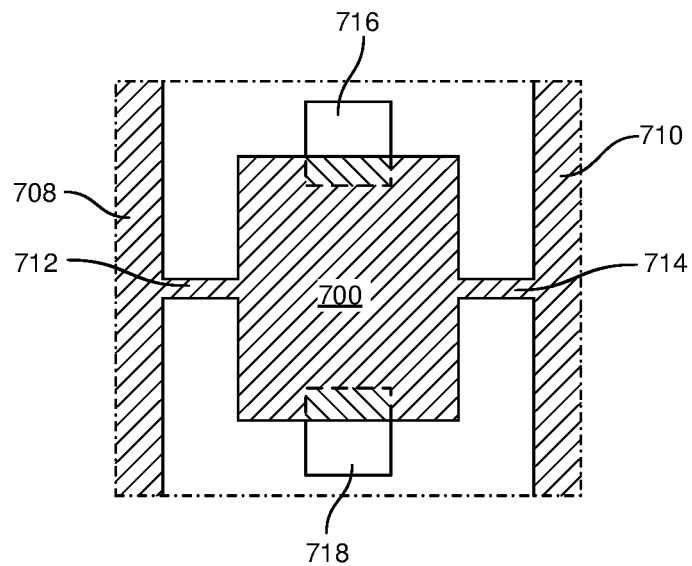

FIGS. 7A and 7B show an example device including an NVP layer that may be used to improve the mechanical stability of, for example, thin MEMS devices.

FIG. 7A shows a cross-section through a multilayer, which may be a MEMS element 700. FIG. 7A shows the MEMS element 700 including a multilayer that has first, second, and third layers 702, 704, and 706, respectively. In some examples, the outer layers (702 and 706) may include a relatively rigid material (e.g., silicon, or other inorganic layer such as a nitride, oxide, or the like), and the middle layer 704 may include a nanovoided polymer (NVP). By sandwiching an NVP-based layer between two relatively rigid layers of the MEMS element, a MEMS element may be obtained, for example having a similar rigidity as a single-layer MEMS element with the same thickness but having lower weight.

FIG. 7B shows an example MEMS device including the multilayer MEMS element 700 having a cross-section as illustrated in FIG. 7A. FIG. 7B shows the MEMS element 700 (which may be e.g. generally rectangular or square) with two supports (712 and 714, which may be torsional supports) connecting the MEMS element 700 to support regions 708 and 710, respectively. The orientation of the MEMS element 700 may be controlled using control electrodes 716 and 718, for example using electrostatic attraction and/or electrostatic repulsion. A MEMS element may further include one or more electrodes and appropriate connections. The device may be configured as a beam deflector, or may be a component of a display, such as a projection display or reflective display. In some examples, a MEMS element may have an I-beam like cross-sectional structure. In some examples, a MEMS device may include (or control) an optical element such as a lens or mirror. In some examples, a surface of the multilayer MEMS element (such as the upper surface of layer 702 or other portion of MEMS element 700) may support a reflective layer (e.g., a mirror). For example, a multilayer surface may be at least partially metallized.

In some examples, a device may include an optical switch, a digital light processing device, a digital micromirror, or beam steering device. For example, a mirror may be supported on an adjustable support layer. The mirror may include a metal, such as aluminum. The support layer for the mirror may include a multilayer structure, and may be a multilayer MEMS element such as shown at 700. The multilayer structure may include an inorganic layer/NVP layer combination, a non-voided polymer/NVP layer combination, a three-layer structure with either the inorganic layer, non-voided polymer, or the NVP as the middle layer of the three, or a larger multilayer structure including such examples therein. A MEMS device may include a silicon/NVP layer structure, or a silicon/porous silicon layer structure, for example, to reduce weight, improve actuation, improve device speed, and the like.

Figure 8:
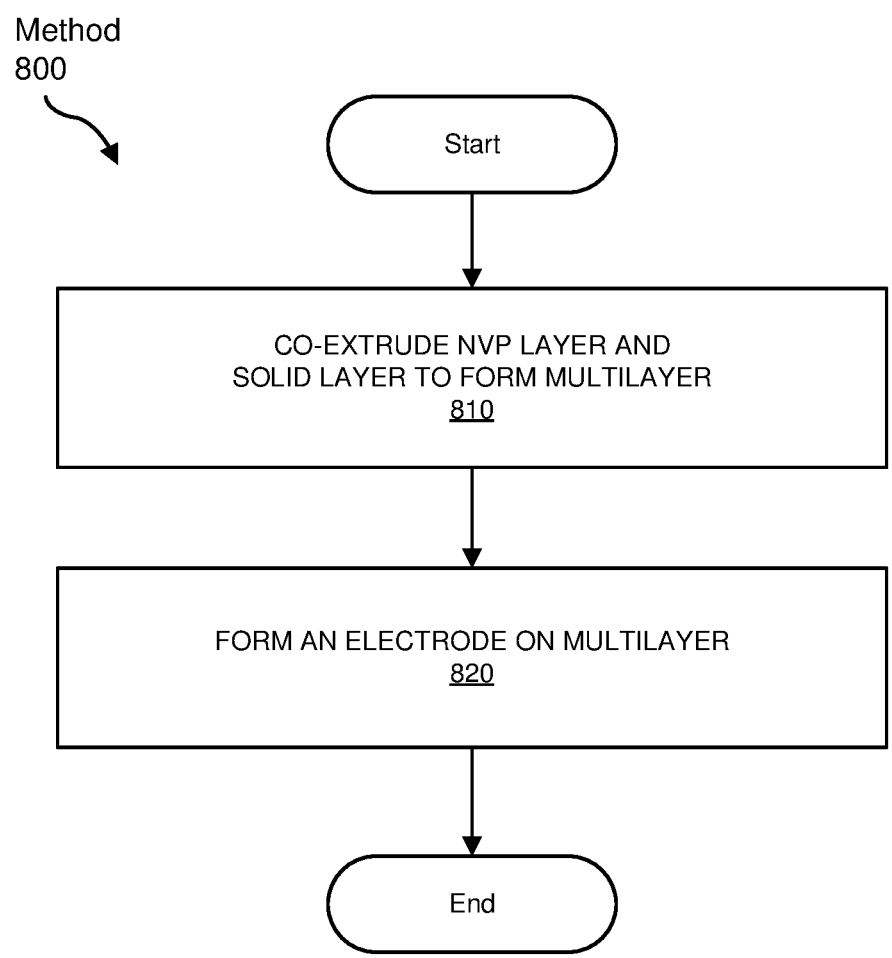
FIG. 8 is a flow diagram of an exemplary method for fabricating a functional material.

FIG. 8 shows an example method 800, for example for forming a functional material including a nanovoided polymer layer and a solid layer. The solid layer may include a solid polymer layer, an inorganic layer, or other non-nanovoided layer. The method may include co-extruding the nanovoided polymer layer and the solid layer to form a multilayer structure (810). The method may further optionally include forming at least one electrode on the multilayer structure (820). For example, the method may further include forming a first electrode and a second electrode on the multilayer structure so that at least part of the multilayer structure is located between the first electrode and the second electrode. In some examples, forming the functional material may include folding the multilayer structure, or depositing multiple layers of, for example, the extrudate, to form a multilayer with additional layers. In some examples, formation of a multilayer may include conforming the multilayer onto a substrate, such as a substrate including an electrode, a non-planar substrate, or the like.

Figure 9:
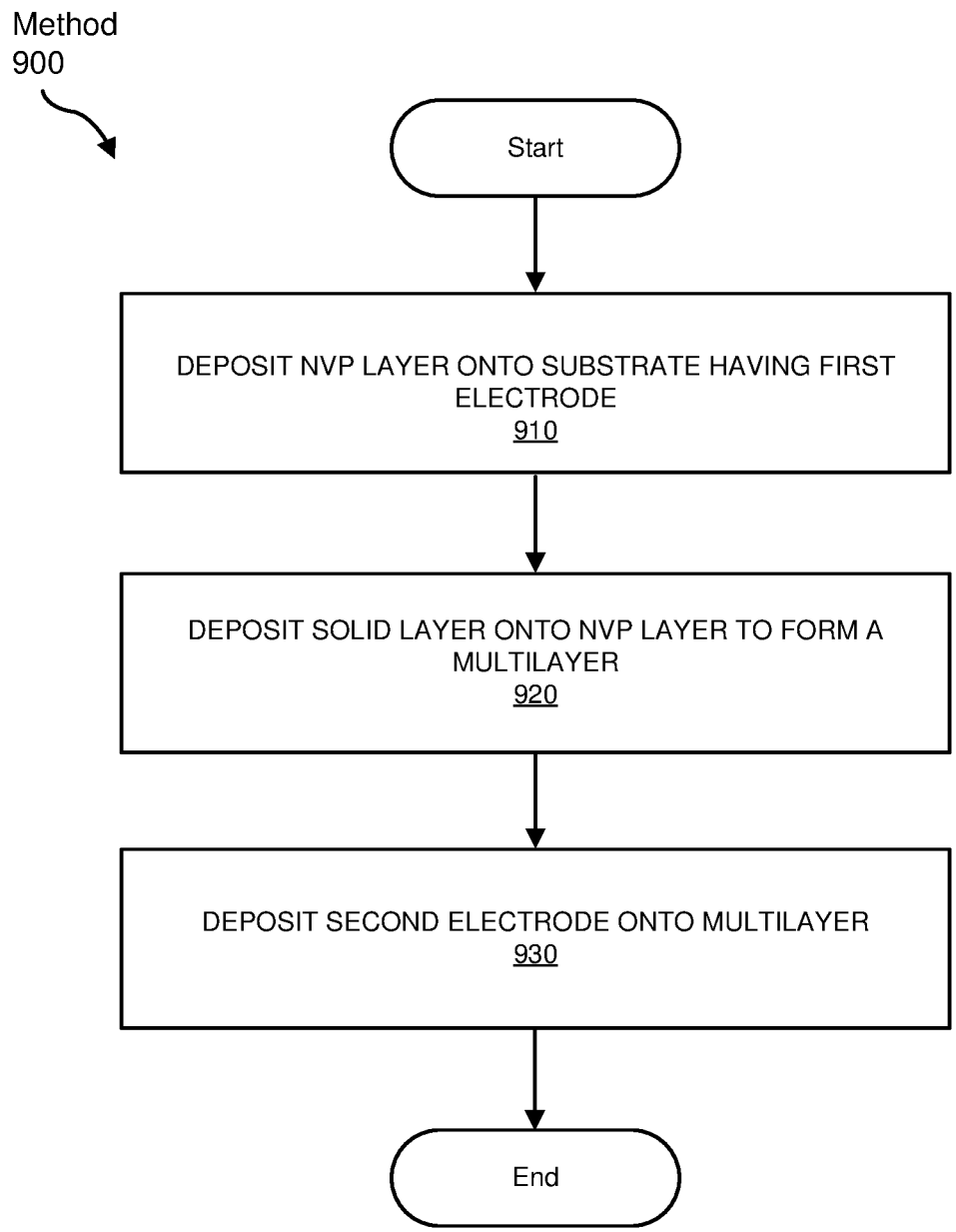
FIG. 9 is a flow diagram of an exemplary method for fabricating a functional material.

FIG. 9 shows an example method 900, for example for forming a functional material. The example method may include depositing an NVP layer onto a substrate including a first electrode (910), depositing a solid layer to form a multilayer (920), and depositing a second electrode onto the multilayer. The method may be used to fabricate a device, such as an actuator and/or a sensor. In some examples, a solid layer may be deposited onto a substrate having a first electrode, and the NVP layer may be deposited onto the solid layer. In some examples, one or more steps may be repeated to obtain a multilayer with additional solid layers and/or NVP layers.

In some examples, forming a multilayer may further include depositing additional layers, either on or within the multilayer structure, such as reflective layers, grating layers, holographic layers, other optical layers, other dielectric layers, other electrically conducting layers or patterns, or other layers or structures.

Figure 10:
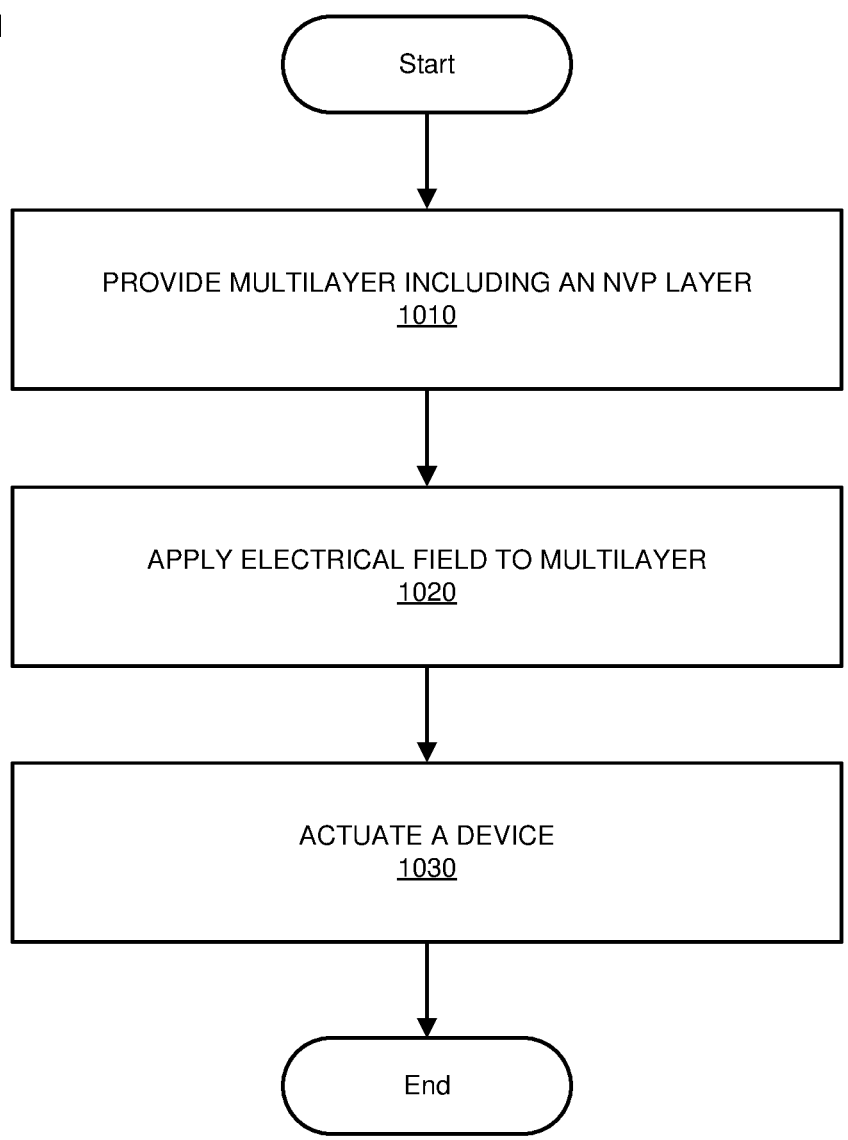
FIG. 10 is a flow diagram of an exemplary method for actuation of an exemplary device.

FIG. 10 is a flow diagram of an exemplary method for actuation of an electroactive device. The example method 1000 may include providing a multilayer including an NVP layer (1010), applying an electric field to the multilayer (1020), and actuating a device (1030), for example based on an electric-field induced deformation of the multilayer. For example, an electric-field induced deformation may be used to actuate a haptic device (e.g., to provide haptic feedback to a person), deform an optical element, or otherwise actuate a device.

In some examples, a sensitive material (such as an air or moisture sensitive material) may be protected by a barrier layer. In some examples, the sensitive material may be encapsulated by the barrier layer. The barrier layer may include an inorganic layer (such as a nitride, oxide, carbide, halide, or other inorganic layer, a metal layer, a glass layer, a ceramic layer, a relatively impermeable polymer layer, other layer, or a layer including some combination of components) and an NVP layer. The barrier layer may include a first inorganic layer and a second inorganic layer with an NVP layer located between the two inorganic layers. The barrier layer may function as a diffusion barrier layer to prevent contaminants from diffusing into a sensitive material. In some examples, the barrier layer may include components that bind, degrade, repel or otherwise help prevent contaminants from passing through the barrier layer. In some examples, an exterior surface and/or interior surfaces of the NVP may be functionalized to bind to contaminants. In some examples, the NVP may dissolve contaminants, for example by dissolving oxygen into a polymer matrix. The NVP may be fabricated so that voids contain an inert gas, such as nitrogen, a noble gas such as argon, or other gas that is substantially non-reactive to the sensitive material.

In addition, a corresponding device may include one or more barrier layers to prevent contamination of sensitive materials within the device. Barrier layers may prevent contaminant ingress from one or more surfaces or interfaces of the device, such as contaminants that result from (or pass through) an electrode, other layer, or exposed surface, such as ambient oxygen, moisture, and the like. In some examples, the above-described barrier layer may also function as a planarization layer that appreciably reduces the surface roughness of an NVP, for example an NVP-based electroactive element used in an actuator or sensor. In some examples, an electrode may be deposited on the barrier layer.

In some examples, a multilayer may include one or more thermoset materials. The multilayer may have a stacked configuration, and may have an elastic modulus of less than or approximately equal to 10 GPa, and in some examples less than or approximately equal to 1 GPa, for example, less than or approximately equal to 0.5 GPa. In this example, polymers in the multilayer may be cured.

In some examples, a multilayer may be formed by layer-by-layer assembly. Device fabrication may include one or more of the following deposition processes: spin coating, printing such as inkjet printing, other types of printing, vapor deposition such as chemical vapor deposition, vapor coating, thermal spraying, lamination (e.g., of one or more previously formed layers together), transfer of separately formed material layers formed by any deposition process (such as those mentioned herein), and/or any other deposition process or any combination thereof. In a transfer process, a polymer may be coated on a separate substrate surface, and subsequently picked up and placed on a layer of the multilayer (e.g., an NVP layer). A transferred layer may be adhered to another layer using a layer of glue, reaction between surface chemical groups, electrostatic interactions, fasteners such as edge connectors, pressure, thermal approaches such as thermal fusion, another approach, or combination thereof. Similar approaches may be used to adhere any two adjacent layers, as appropriate. In some examples, a multilayer is formed by co-extrusion of two or more layers of the multilayer at the same time. In some examples, fabrication of the multilayer may include treatment with plasma, gas, or coating with a thin film of a high surfactant material, for example as a surface pretreatment before deposition of another layer on the surface.

A multilayer may have a stacked structure, may include one or more polymers, and may include different polymers in different layers of the multilayer, or as a polymer blend in a single layer. A multilayer may include, for example, one or more polymers such as polysiloxanes (such as poly(alkyl siloxanes), poly(dimethyl siloxane), and derivatives thereof), acrylic polymers (such as polymethylmethacrylate and free-radical-initiated polyacrylates), or a silicone-based polymer (such as polydimethylsiloxane or any silicone polymer such as a silicone polymer cured with a hydrosilylation catalyst).

Polymers have a broad range of applications due to the wide tunability of their electrical, mechanical, thermal and optical properties. However, it may be difficult to achieve optimal physical and/or electrical parameters, e.g., for an electroactive device, using a single polymer. Electroactive polymers may provide an efficient way for converting electrical power to mechanical power, and vice versa, and may prove useful for actuators and sensors amongst various applications. Electroactive polymer performance may be limited due to electromechanical breakdown of the polymer, for example for an actuator with operation at high voltage. For many applications, there is a need for actuators with reduced operating voltage and higher energy density.

As detailed above, improved performance and enhanced functionality of electroactive polymers and electroactive devices (e.g., devices including electroactive polymers) may be achieved using a multilayer. The use of a multilayer may allow adjustment of more parameters for device improvement or optimization. Nanovoided polymers (NVPs) are a new class of materials which also allow adjustment of various parameters, such as polymer matrix composition, void size, void shape, void composition (e.g., for fluid-filled voids), layer thickness, and the like. Examples include improved electroactive devices, where an electroactive device includes devices that either convert electrical energy to mechanical energy, or the reverse, or both, such as actuators, sensors, and combinations thereof. Electroactive devices may also include an optical element.

Examples include a multilayer, which may include a stack of layers, such as thin films, for example with a minimum of two layers. The multilayer may include a layer of nanovoided polymer. Each layer may have a thickness between approximately 10 nm and approximately 500 µm, summing up to a total multilayer thickness of between, for example, approximately 200 nm and approximately 1 cm.

Devices may include one or more electrodes, which may include, for example, a thin, optionally flexible, electrically conductive layer. Devices may include one or more nanovoided polymer layers. A voided polymer may represent a polymer material with voids. In nanovoided polymers, the voids may have a typical diameter or similar dimension of less than approximately 1 micron, for example, a dimension of between approximately 10 nm and approximately 500 nm, such as between approximately 50 nm and approximately 200 nm. The voids may be closed cell (in which voids are isolated and enclosed by polymer) or open cell (in which voids are connected to each other). Voids may be filled with gas, such as air, nitrogen, an inert gas, a dielectric gas (e.g., a gas chosen to increase mean permittivity, such as sulfur hexafluoride), or other gas. In some examples, voids may be liquid filled, for example by a non-polymeric material. In some examples, a nanovoided polymer is fabricated with liquid in the voids, then some or all of the liquid is removed leaving at least partially gas-filled voids.

Examples of the instant disclosure include new functional materials including a nanovoided polymer (NVP). The nanovoids in the polymer film may provide an added degree of tunability in terms of overall macroscopic properties of electrical, mechanical, thermal, diffusive, and/or chemical.

In some examples, a device including a multilayer of thinner layers of bulk polymer (non-voided polymer) and an NVP can improve the dielectric breakdown performance of the device. Comparing a bulk polymer with a nanovoided polymer of the same material, the bulk polymer may show higher permittivity, because of higher polymer content, but also a lower dielectric breakdown. A multilayer structure having alternating layers of non-voided (bulk) polymer and nanovoided polymer may allow increased permittivity (relative to an NVP) while also increasing the dielectric breakdown strength (relative to a non-voided polymer). During dielectric breakdown of a single non-voided dielectric polymer layer, an avalanche of electrons may travel through the polymer in a tree-like fashion, starting at one electrode, and once reaching the other electrode, the dielectric polymer is electrically shorted. An NVP layer can act as a barrier for electrical breakdown, as the mean free path of electrons in an NVP is so short that electrons cannot gain sufficient energy from the applied field. The Introduction of the NVP layer may increase the voltage that can be applied to the device before dielectric breakdown occurs, for example, by reducing the mean free path of electrons and electron discharge path lengths.

In some examples, a device according to the instant disclosure may include an NVP layer alternating with one or more layers of a better insulating, inorganic material layer to improve the dielectric breakdown performance of the NVP. Alternating layers of inorganic insulating material and NVP layers can reduce dielectric breakdown, and increase the voltage that can be applied to the device before dielectric breakdown occurs.

In some examples, the NVP may have different mechanical properties (e.g., Young's modulus, creep rate, toughness, tan delta, etc.) compared to a non-voided polymer. A non-voided polymer may also be referred to as a bulk polymer or a solid polymer. In addition, device may include a multilayer including nanovoided and non-voided polymers, for example as alternating nanovoided and solid (non-nanovoided layers), which may in turn enable the tuning of mechanical properties of, for example, the overall electroactive element or device. For instance, a multilayer including nanovoided and non-voided polymer layers, presenting a periodically varying Young's modulus, can greatly improve the resistance of the multilayer to cracks or fractures. A multilayer including one or more NVP layers can provide low stiffness, tunable via the void fraction of the NVP layer(s). An example multilayer may include alternating layers of NVP and a relatively rigid bulk polymer, and the development of cracks in the multilayer or electroactive element including such a multilayer can be effectively reduced or substantially eliminated. Mechanical properties can also be optimized or otherwise modified by stacking NVP layers with different void fraction, different layer thickness, void shapes, polydispersity of voids as well, as NVP layers made of different materials. For example, a multilayer may include nanovoided polymer layers having different characteristics, and may further include one or more solid layers. A solid layer may have a void fraction of less than 10%, in some examples less than 5%, and in some examples less than 1%. In some examples, a multilayer may include first and second nanovoided polymer layers having appreciably different void fractions, for example having first and second void fractions that differ by at least 20%, or by at least 50%. Layers having appreciably different void fractions may be arranged in an alternating configuration, and a multilayer may further include one or more solid layers.

In some examples, a device includes an electroactive NVP and a material providing rigidity to mitigate pull-in instability. Such instability may occur in an actuator including a dielectric thin film located in between two electrodes. As an electric field is applied between the electrodes, the dielectric material may thin down in the direction of the applied field and expands in a lateral direction. As the thickness of the thin film decreases below a certain threshold, an electromechanical instability may be triggered, leading to a catastrophic thinning of the film. To mitigate this pull-in in the NVP, the NVP can be pre-stretched in the lateral direction. This can be achieved through a multilayer polymer design by coating a more rigid polymer on a pre-stretched NVP. Hence, in some examples, an NVP layer is combined with another layer to lock in pre-stretching of the NVP layer. The pull-in can also be mitigated by providing ways of restricting the gap size between the electrodes, using nonlinear springs attached to the electrodes in the direction of the applied field which toughen as the gap size reduces. In some examples, one or more spacers may be used to provide a predetermined or minimum electrode separation at one or more locations within the device.

In some examples, an NVP may be combined with an inorganic material to form a diffusion barrier that has the ability to soak up gases or moistures, thereby protecting sensitive materials against the environment (such as water, gases, etc.). In some examples, an inorganic material with low diffusivity may act as a diffusion barrier, while the NVP can provide high solubility and diffusivity. The multilayer may function as a getter. The inorganic material can include, for example, an oxide, a nitride, a carbide, or other inorganic material.

In some examples, an NVP is used as a hybrid layer for materials that are incompatible with one another. The NVP can generate a hybrid bulk material. The NVP non-planarized surfaces (tunable by void fraction, void size, etc.) may facilitate the adhesion of materials that may not adhere to a planar non-voided film. Surface roughness and/or surface porosity may be adjusted to obtain desired wetting properties (e.g., wetting angle, surface energy, or the like) of the NVP surface to accommodate materials that would otherwise not wet to the surface, including materials such as a fluoropolymer (e.g., a polymer of one or more fluoroethylenes, such as polytetrafluoroethylene (e.g., Teflon) and the like, and derivatives and blends thereof).

In some examples, an NVP can act as a thermal heat insulator, for example, if there is a significant volume fraction of gas-filled voids. An NVP based thermal insulator can be used to insulate a device, or to insulate two thermally sensitive layers from one another, for example by keeping heat energy constrained to the warmer layer and/or excluded from a cooler layer.

In some examples, an open cell voided polymer can act as a heat sink where the heat capacity can be engineered through the surface of the voids. By tuning the heat capacity of the polymer material, layers adjacent to the NVP can be cooled by flowing cold gases (at least, cooler than the item to be cooled) through the NVP layer, thereby efficiently conducting heat away. The device may function as a radiator, and fluids such as gases and liquids can be passed through it.

In some examples, an NVP may be used in a functional device where exposure to UV radiation occurs such that the device is protected from too much UV exposure and aging of material properties by adding layer/layers of material blocking UV radiation. A blocking material can include, for example, an inorganic layer such as an oxide, a nitride, a carbide, a halide, or other inorganic material.

In some examples, the foam-like structure of the NVP can be used as a sound absorption layer or a sound suppression layer, where the amount of sound absorption and sound reflection can be engineered through the NVP characteristics. The NVP layer can suppress the penetration of acoustical signals. The amount of sound absorption and sound reflection can be engineered through the NVP characteristics.

In some examples, a multilayer may be used to transform sound into electrical signal and/or vice versa, taking advantage of the low inertia of the NVP in combination with its mechanical properties. The strength of the electromechanical coupling can be tuned not only via the material composition of the NVP and bulk polymers, but also via the void fraction. By applying a bias voltage to the polymer actuator, the mechanical properties of the NVP can be fine-tuned, enabling a large dynamically adjustable range of sound frequencies and amplitudes which can be detected as well as synthesized.

In some examples, an NVP can be used as an impedance matching layer disposed between two dissimilar materials. With an NVP impedance (e.g., mechanical, thermal) in between the other two materials, the NVP can act as a mediating layer increasing the overall energy transmission. In some examples, an NVP may be used as an ultrasound impedance matching layer.

In some examples, an NVP can be used as an impedance mismatching layer in between two materials. With an NVP impedance (mechanical, thermal) very different from the other two materials, the NVP can act as a decoupling layer suppressing crosstalk between the two adjacent materials.

In some examples, an NVP is used to improve the mechanical stability of thin micro-electro-mechanical systems (MEMS) devices. Usually, there is a tradeoff between total weight and structural rigidity of MEMS devices. By sandwiching a layer of NVP in between two layers of MEMS, an effectively thicker MEMS device with similar rigidity to a single MEMS of the same thickness, but lower weight, can be created.

In some examples, a multilayer may be used to sense the amount of actuation by measuring the capacitance of the multilayer. The capacitance of an electroactive polymer is inversely related to the electrode distance and thus may allow for an accurate determination of the displacement. This in turn can also allow strain measurement. For example, a pair of electrodes may be deposited, one on each side of a multilayer element, and the capacitance between the electrodes used to determine the electrode distance and hence a deformation of the multilayer structure. Deformations may be determined at one or more locations, and a dynamic signal may be obtained to determine time-dependent deformations.

In some examples, a multilayer may be used as a vibration damping layer, which may allow not only for passive, but also for active vibration suppression using an electrically-driven actuator to apply a force opposite to the force created by the vibrations on the actuator membrane.

In some examples, a multilayer may be used as a low k dielectric (a dielectric material with a small dielectric constant) providing electrical insulation up to high frequencies. Low k dielectrics including a multilayer may be used in microelectronics, as they allow for size reduction of devices without affecting device performance. The void fraction of the NVP may be adjusted to obtain a desired effective dielectric constant of the multilayer.

In some examples, a multilayer may be used as an energy generator (or transducer) converting mechanical energy into electrical energy. As an actuator is strained by external forces, (such as forces generated by wind, water, motion, vibration, acceleration, human input (such as touch, human motion, and the like) and/or acoustic signals) a voltage generation occurs based on the electrostatic principle. By optimizing the multilayer for a large dielectric constant, low dielectric losses, low conductivity, and good mechanical properties, a powerful and/or efficient generator (or transducer) may be realized. Examples include energy generating devices, generators, sheets, fabrics, components, and the like.

In some examples, a multilayer may be used as a loudspeaker, a microphone, or may function both as a loudspeaker and a microphone.

A multilayer (e.g., including of one or more polymer-based layers such as a nanovoided polymer layer) can be fabricated by a process such as co-extrusion or layer-by-layer deposition.

A multilayer may include one or more polymers such as acrylates, halogenated polymers (such as fluoropolymers including polyvinylidene fluoride (PVDF), and copolymers of PVDF including PVDF:TrFE), other polymers, or blends or derivatives thereof. Example polymers may include nanoparticles to increase the dielectric constant of the polymer composite (e.g., relative to the bulk polymer). Nanoparticles may include a titanate (such as barium titanate, barium strontium titanate BaSrTiO3, or PbLaZrTiO3), an oxide (such as TiO2, CeO2, Al2O3, Ta2O3, SiO2, or other metal or non-metal oxide), compounds such as PbMgNbO3+PbTiO3, or other inorganic nanoparticles. Mixtures of curable monomers with cured polymers may also be used. Stabilizers might also be used to prevent degradation from the environment. Example stabilizers include antioxidants, as well as light and heat stabilizers.

In some examples, a nanovoided polymer element includes shaped voids in a polymeric matrix. Example applications include nanovoided polymer devices, such as actuators, sensors, and optical elements.

In some examples, a device, such as a polymer actuator, includes nanovoids having spherical shapes, or in some examples the voids may have generally non-spherical shapes. The nanovoid shapes may be configured to suppress buckling in the material and allow the material to be greatly compressed from its original shape in a controllable manner. The nanovoids may be gas filed, for example air-filled.

In some embodiments, an NVP material may be formed from a mixture that includes a curable material (e.g., a mixture including one or more monomers, oligomers, and/or prepolymers) and one or more solvents. In some examples, the solvent may be evaporated from nanovoids of the electroactive material. In at least one example, partial solvent evaporation may be allowed before full curing of the curable material. This may induce partial nanovoid collapse, and formation of anisotropic nanovoids, such as, for example, ovoid and/or disk-shaped nanovoids. The curable material may, for example, be partially cured before partial (or complete) solvent removal from the electroactive material, for example, to achieve partial (or otherwise limited) nanovoid collapse. Following partial curing and at least partial removal of the solvent from the nanovoids, the curable material may be further cured and remaining solvent may then be removed, leaving anisotropic nanovoids in the resulting electroactive material. In some embodiments, such initial partial curing and subsequent curing may be accomplished via, for example, a two-stage polymerization process to form a network of first and second stage polymers. In another embodiment, the curable material may include an emulsion of polymer forming components that may be partially cured, and the partially cured emulsion may be stretched (e.g., stretched optionally while the emulsion is on a substrate) in one or two directions (e.g., orthogonal directions). Further, the stretching may be about 1.5×, (alternatively about 2×, alternatively about 3×, alternatively about 5× the original dimensions of the emulsion). Afterwards, the emulsion may be further cured and the solvent may be removed thereafter.

In various embodiments, the nanovoided materials may also include a surfactant. In some embodiments, the surfactant may provide improved compatibility between the polymer and monomer, or between the polymer and the solvent. Alternatively, or in addition, the surfactant may reduce the surface energy of the nanovoids, which can reduce adhesive forces when the nanovoids are compressed.

Examples include polymer devices, such as a polymer actuator. An example actuator includes a long thin block of material, which may include one or more layers. A polymer actuator may compress in response to an applied electrical field. The degree of compression may be controlled by controlling the magnitude (e.g., the root mean square (rms) value) or the applied electric field. The actuator may take on a desired configuration and may exert a force on an adjacent surface. In some examples, the actuator may be used to modify an optical element (e.g., adjust the focal length of a flexible lens), or provide haptic feedback.

In example applications, several polymer actuators can be positioned along the rim of a pair of glasses including a flexible lens, such as a lens filled with a liquid. An electric field can be used to move the actuators so that they exert a force on the lens, and change the focal point of the lens. Actuators may be configured to move an adjacent surface, for example by distances up to 1 cm. The electrode separation may be of millimeter or sub-millimeter order to maintain reasonable voltage requirements for the actuator (e.g., less than 1 kV).

An actuator in compression may expand laterally, unless the actuator is laterally constrained, for example by sidewalls. If the electroactive element of the actuator is constrained so that it cannot expand laterally, the force required to compress a solid electroactive element may be relatively high, particularly if the electroactive element polymer material is close to incompressible. An NVP material may include many small pockets of air (nanovoids). In some embodiments, an NVP may be useful as an electroactive element, as it takes less force to compress the NVP than a similarly sized solid polymer element. In some examples, compression of air in the voids may require one or more orders of magnitude less force than that required to compress a solid block of material. Further, components of air (e.g., nitrogen, oxygen) may dissolve in the polymer under compression, further facilitating compression of the NVP.

In some examples, an actuator may have one or more of the following properties. An actuator may have a predictable and repeatable actuation response to a specified level of electric voltage. For example, the voltage-actuation response may be generally independent of the actuation history (e.g., whether actuation is increasing or decreasing). The actuation mechanism may survive many cycles of extending and retracting. The actuator response time can be sufficiently fast. This depends on applications, but example actuators may have a response time of less than 1 second, for example, from zero to maximum actuation, and, in some examples, the response time may be less than 100 msec. Some example actuators can achieve a maximum bulk compression of 50% or more.

Actuation may be measured as a bulk compression. Compression may be measured in absolute units (e.g., a length unit) or as a fraction, for example, the fraction of the deformation relative to an original undeformed dimension of the actuator. For example, if the actuator is compressed and the thickness after compression is 70% of the original uncompressed thickness, then the bulk compression is 30%.

Nanovoids may include a hole (void) in an otherwise solid polymer that is filled, for example, with air or an inert gas such as nitrogen. A nanovoid may have a diameter or other analogous dimension less than 1 micron, for example in the range of approximately 1 nanometer to approximately 1 micrometer. The void fraction is the fraction of volume of the actuator (when in its original state with 0% bulk compression) occupied by voids, for example by air or an inert gas.

Examples devices include an electroactive device, such as an actuator, having a multilayer electroactive element. For actuator use, an electrical voltage may be applied between two electrodes, where at least a part the NVP is between the two electrodes.

Example devices include actuators, for example having electrically-controllable compression, curvature, pressure on skin, texture, vibration, or other haptic function. Devices may be stacked to increase actuation. Example devices may be used to control optical elements, such as focal length or positional adjustments of lenses, mirrors, or other optical elements. Applications include improved autofocus and adaptive optics applications, such as in imaging devices. Applications also include wave-front correction of optical or other electromagnetic fields, for example, in projection systems. Examples include fine control actuators that can be combined with a coarser control actuator for extended actuation range. In some examples, actuators may be stacked to obtain enhanced actuation range.

Example devices also include sensors responsive to, for example, pressure (e.g., touch, acoustic signals), temperature, and the like. A sensor circuit may determine the magnitude of a mechanical input from a capacitance change. Example device structures described herein may also provide improved capacitance-deformation curves and improved sensor accuracy. Devices, such as sensors and actuators, may be curved, flexible or otherwise conformal to an underlying substrate.

Example devices may include optical elements, such as gratings, holographic elements, lenses, mirrors, and the like. Electrodes may be transmissive or reflective. A device with reflective or transmissive electrodes may be an electrically-controllable optical element. In some examples, electrodes may be stretchable allowing bending. An example device may function both as an actuator and a touch sensor and may also be reflective and/or optically transparent. Examples also include actuators configured to control a flexible lens (e.g., a liquid lens), flexible mirror, grating, prism, fiber, holographic element, or other optical element.

An electroactive device may include any device that either converts electrical energy to mechanical energy, or the reverse, or both, such as a sensor and/or an actuator. Electroactive devices may be used as haptic devices, optical elements, and other applications.

A nanovoided polymer may include a polymer material having voids therein. The voids may have a typical dimension of between approximately 10 and approximately 500 nm, such as between approximately 50 and approximately 200 nm. The voids may be closed cell (in which gas phase regions are isolated and surrounded by polymer) or open cell (in which gas phase regions are connected to each other). The nanovoided polymer element may be a layer having a thickness between 200 nm and 1 cm, for example between 200 nm and 1 mm.

Polymer layers used in a multilayer electroactive element may include one or more of: acrylates, halogenated polymers such as fluoropolymers including polyvinylidene difluoride (PVDF, polytetrafluoroethylene), copolymers of PVDF including PVDF:TrFE (poly(vinylidene fluoride-trifluoroethylene)), other fluorinated polyethylenes, other fluorinated polymers, other polymers, or blends or derivatives thereof. The polymers may include nanoparticles to increase dielectric constant, such as inorganic particles such as: titanates (including barium titanate or barium strontium titanate (BaSrTiO3); oxides such as titanium dioxide (TiO2), tantalum oxide (Ta2O3), aluminum oxide ($Al_2O_3$), or cerium oxide (CeO2); other metal oxides such as other transition metal oxides, other non-metal oxides, or other compounds such as PbLaZrTiO3, PbMgNbO3+PbTiO3. In some examples, mixtures of curable monomers with cured polymers may also be used.

A controller may be configured to apply electrical signals to a plurality of electrodes of an electroactive device, for example, to obtain a desired surface deformation of an actuator and in some examples of an optical element including an actuator, such as a lens or mirror.

In some examples, a spatially addressable electroactive device may include a multilayer electroactive element including at least one nanovoided polymer (NVP) layer, the multilayer electroactive element having a first and second surface; a first electrode supported by the first surface, and a second electrode supported by the second surface. Example devices include a spatially addressable electroactive device such as an actuator, an optical element such as a transmissive or reflective optical element, or a sensor.

In some example devices, electrodes may be stretchable. In some example devices, an electrode may be disposed on a substrate, which may be a flexible and/or stretchable substrate. In some example devices, an NVP may support a plurality of electrodes (e.g., including the first electrode in examples above), and the second electrode may be a common electrode, such as a ground. In some examples, electrodes may include an array of electrical conductors of a pre-defined shape arranged in a pre-defined pattern.

In some examples, an electroactive device may be spatially addressable, and may provide the ability to apply and/or read different signals at different spatial locations on the device. In some examples, multiplexing schemes can be used to apply electrical signals. In some examples, electrode pairs may be provided by the intersection of electrode stripes on each side of the NVP, for example between orthogonal electrode stripes.

Example devices may be used in a range of applications. For example, a spatially addressed nanovoided polymer can be locally actuated. Actuation may be controlled by the size and arrangement of the electrodes at that location, and the amount of voltage applied at those electrodes. Example devices can be used as an optical element, a touch sensor, a thermal sensor, a pressure sensor, or a haptic element in a wearable device.

A device or system may further include a control circuit, with the control circuit being configured to apply an electrical potential between the first electrode and the second electrode. The control circuit may be further configured to determine a physical deformation between the first electrode and the second electrode, for example, based on a capacitance determination. An example device may be generally transparent, for example including a nanovoided polymer that is generally transparent, and transparent electrodes (e.g., transparent conductive oxide electrodes such as tin oxide, indium tin oxide, and the like). A first electrode (and/or a second electrode) may be generally transparent, or in some examples may be generally reflective. A device may be flexible, and in some examples transparent and flexible.

A device may include a spatially addressable actuator. Application of an electrical signal between the first electrode and the second electrode, and/or between other electrodes of the device, may induce a two-dimensional and/or three-dimensional conformational change of the nanovoided polymer element.

In some examples, the device is an electrically controllable optical element, which may include one or more of a mirror, a lens, a prism, a grating, a phase plate, a diffuser, a holographic element, a beam splitter, a beam combiner, or an optical filter. In some examples, the device may include a sensor, such as a touch sensor. An actuator may be controlled by an electrical potential between the first electrode and the second electrode, and a sensor responsive to a capacitance between the first electrode and the second electrode may be used to determine a degree of actuation (such as a displacement, relative displacement, or other deformation parameter.

In some examples, a computer-implemented method includes application of electrical signals to a plurality of electrodes to obtain a desired surface deformation of an actuator, wherein the actuator includes a multilayer electroactive element.

In some examples, a non-transitory computer-readable medium includes one or more computer-executable instructions that, when executed by at least one processor of a computing device, cause the computing device to control application of electrical signals to a plurality of electrodes to obtain a desired surface deformation of an actuator by application of electrical signals to electrodes, wherein the actuator includes a multilayer electroactive element.

In some examples, signals of the same polarity may be applied to proximate electrodes to generate electrostatic repulsion and, e.g., an increase in electrode separation.

In some examples, a computer-readable medium may include one or more computer-executable instructions that, when executed by at least one processor of a computing device, may cause the computing device to apply electrical signals to a plurality of electrodes of an electroactive device including a nanovoided polymer (NVP) element, to obtain a desired surface deformation of the electroactive device, wherein the electroactive device includes a multilayer electroactive element.

In some examples, a device includes a multilayer structure, a first electrode, and a second electrode, where the multilayer structure is located at least in part between the first electrode and the second electrode, and the multilayer structure includes a nanovoided polymer layer and a solid layer. The solid layer may include a non-nanovoided layer, and may include a polymer. The nanovoided polymer layer may be an electroactive layer. The nanovoided polymer layer and the solid layer may both include the same polymer. In some examples, the solid layer may include an inorganic layer, and the solid layer may include at least one of an inorganic oxide or a metal. In some examples, the solid layer may include a dielectric polymer. For example, the solid layer and the nanovoided polymer layer may both include a fluoropolymer. In some examples, the nanovoided polymer layer has first dielectric breakdown voltage, the solid layer has a second dielectric breakdown voltage, and the first dielectric breakdown voltage is higher than the second dielectric breakdown voltage. A device may be, or may include, an actuator, a sensor, a microphone, a speaker, or an electrically controllable optical element.

In some examples, a device includes a multilayer structure that includes a nanovoided polymer layer and a solid layer, where the solid layer is a non-nanovoided layer. An example device may be, or include, a MEMS device, a heatsink, a heat spreader, an acoustic absorber, a thermal barrier, a high dielectric breakdown layer, a low k dielectric, or a diffusion barrier. The device may include a first electrode and a second electrode, where the device is configured so that a device parameter is controllable by an electrical signal applied between the first electrode and the second electrode. The device parameter may be a flow rate of a fluid through the device, a layer thickness, a degree of actuation, a thermal conductivity, a dielectric breakdown strength, an acoustic absorption, a reflectivity, a transmission, a phase delay for electromagnetic radiation, a reflected beam direction, a focal length, an oscillation frequency, an absorption resonance frequency, a curvature, a vibrational resonance spectrum, or a vibrational amplitude. The device may be, or include, a sensor responsive to a sensed parameter, the sensed parameter being determined based on a device electrical response. The sensed parameter may be a mechanical input, an acoustic amplitude, a pressure, a temperature, a vibrational amplitude, or a position. The device electrical response may include a change in an electrical parameter, such as an electrical capacitance or an electrical conductivity determined between the first electrode and the second electrode.

In some examples, a device may include a multilayer structure including a first layer, a second layer, and a third layer, where the second layer is located between the first layer and the third layer, and at least one layer is a nanovoided polymer layer. For example, the second layer may be a nanovoided polymer layer, and the first and third layers are both solid polymer layers. In some examples, the second layer includes a solid polymer layer, and the first and third layers are both nanovoided polymer layers. A device may include a first electrode and a second electrode, the multilayer structure being located at least in part between the first electrode and the second electrode.

In some examples, a device may be, or include, an actuator, a sensor, or an optical element. A device may further comprise a control circuit configured to apply an electrical potential between the first electrode and the second electrode. A device may include a spatially addressable actuator, and may be flexible. Application of an electrical signal between the first electrode and the second electrode may induce a deformation of the nanovoided polymer element. In some examples, a device may be, or include, an electrically controllable optical element, and may include one or more of a mirror, a lens, a prism, a grating, a phase plate, a diffuser, a holographic element, a beam splitter, a beam combiner, and/or an optical filter.

In some examples, a computer-implemented method includes applying an electrical signal between the first electrode and the second electrode of a device to obtain any desired deformation, such as a surface deformation of the electroactive device. In some examples, a system includes at least one physical processor, physical memory including computer-executable instructions that, when executed by the physical processor, cause the physical processor to apply electrical signals to the device, for example to obtain an actuation of the device. A system may include a haptic device, and the desired deformation (such as a surface deformation) may be induced within the haptic device. A system may include an optical element, and the desired deformation (such as a surface deformation) may be induced within the optical element. In some examples, a non-transitory computer-readable medium includes one or more computer-executable instructions that, when executed by at least one processor of a computing device, cause the computing device to apply electrical signals between the first and second electrodes of the device, for example to obtain a desired actuation of the device. An example method includes depositing a nanovoided polymer layer onto a solid polymer layer (e.g., using a deposition process including at least one of spin coating, printing, chemical vapor deposition, vapor coating, transfer of a prefabricated nanovoided polymer layer, dipping, or spraying) or co-extruding the nanovoided polymer layer and the solid polymer layer to make a multilayer structure. First and second electrodes may be formed on the multilayer structure so that at least part of the multilayer structure is located between the first electrode and the second electrode. An example method may be performed by any suitable computer-executable code and/or computing system. Each of one or more method steps may represent an algorithm whose structure includes and/or is represented by multiple sub-steps An example device includes a nanovoided polymer (NVP) layer, a non-voided layer, a first electrode; and a second electrode. A multilayer structure including a nanovoided polymer layer and a non-voided, or solid, layer may be located at least in part between the first electrode and the second electrode. The device may be, for example, a spatially addressable electroactive device, such as an actuator or a sensor, and may include an optical element. The nanovoided polymer layer and non-voided layer may both include a similar polymer component. Other example devices, systems, components, and methods including combinations of voided and non-voided materials are described.

Embodiments of the present disclosure include electroactive devices, such as actuators, sensors, and optical elements, having, for example, improved electrical control of actuation and/or improved spatial resolution of sensing.

In some examples, a device includes a multilayer structure, a first electrode, and a second electrode, with the multilayer structure located at least in part between the first electrode and the second electrode. The multilayer structure may include a nanovoided polymer layer and a solid layer, the solid layer being a non-nanovoided layer. The multilayer structure may include a multilayer, in which multiple layers are stacked on top of each other. In some examples, a layer may encapsulate one or more interior layers. In some examples, a multilayer structure may form an electroactive element for an electroactive device, such as an actuator or a sensor.

Features from any of the embodiments described herein may be used in combination with one another in accordance with the general principles described herein. These and other embodiments, features, and advantages will be more fully understood upon reading the following detailed description in conjunction with the accompanying drawings and claims.

EXAMPLE EMBODIMENTS

Example 1: An example device includes a multilayer structure, a first electrode, and a second electrode, wherein the multilayer structure is located at least in part between the first electrode and the second electrode, and the multilayer structure includes a nanovoided polymer layer, and a solid layer. The solid layer may include a non-nanovoided layer. The nanovoided polymer layer may be an electroactive layer. The device may further include a control circuit configured to apply an electrical potential between the first electrode and the second electrode, which may induce a mechanical deformation of the multilayer. A solid layer may include a generally non-porous material, for example a layer not having voids intentionally formed within the layer.

Example 2: The device of Example 1, wherein the nanovoided polymer layer is an electroactive layer.

Example 3: The device of any of Examples 1 or 2, further comprising a control circuit, wherein the control circuit is configured to apply an electrical potential between the first electrode and the second electrode.

Example 4: The device of any of Examples 1-3, wherein application of the electrical signal between the first electrode and the second electrode induces a mechanical deformation of the multilayer.

Example 5: The device of any of Examples 1-4, wherein the solid layer includes a polymer.

Example 6: The device of any of Examples 1-5, wherein the nanovoided polymer layer and the solid layer both include the same polymer.

Example 7: The device of any of Examples 1-6, wherein the solid layer is an inorganic layer Example 8: The device of any of Examples 1-7, wherein the solid layer includes an inorganic oxide, or a metal.

Example 9: The device of any of Examples 1-8, wherein the multilayer includes a dielectric polymer.

Example 10. The device of any of Examples 1-9, wherein the multilayer includes a fluoropolymer.

Example 11. The device of any of Examples 1-10, wherein the nanovoided polymer layer has first dielectric breakdown voltage, and the solid layer has a second dielectric breakdown voltage, and the first dielectric breakdown voltage is higher than the second dielectric breakdown voltage.

Example 12. The device of any of Examples 1-11, wherein the device is an actuator, a sensor, a microphone, a speaker, or an electrically controllable optical element.

Example 13. The device of any of Examples 1-12, where the device has a device parameter that is controllable (and/or measurable) by an electrical signal applied between the first electrode and the second electrode.

Example 14. The device of Example 13, wherein the device parameter is a flow rate of a fluid through the device, a layer thickness, a degree of actuation, a thermal conductivity, a dielectric breakdown strength, an acoustic absorption, a reflectivity, a transmission, a phase delay for electromagnetic radiation, a reflected beam direction, a focal length, an oscillation frequency, an absorption resonance frequency, a curvature, a vibrational resonance spectrum, or a vibrational amplitude.

Example 15. The device of any of Examples 1-14, further including a control circuit configured to apply an electrical potential between the first electrode and the second electrode, where application of an electrical signal between the first electrode and the second electrode induces a mechanical deformation of the multilayer.

Example 16. The device of any of Examples 1-15, wherein the device is an actuator and/or a sensor, for example a sensor responsive to a sensed parameter such as a mechanical input, an acoustic amplitude, a pressure, a temperature, a vibrational amplitude, or a position. The sensed parameter may be determined based on an electrical capacitance determined between the first electrode and the second electrode.

Example 17. The device of any of Examples 1-16, wherein the multilayer structure includes a first layer, a second layer, and a third layer, with the second layer located between the first layer and the third layer, and at least one layer is a nanovoided polymer layer.

Example 18. The device of Example 17, wherein the second layer is a nanovoided polymer layer and the first and third layers are both solid polymer layers, or the first and third layers are nanovoided polymer layers and the second layer is a solid layer.

Example 19. A method including depositing a nanovoided polymer layer onto a solid polymer layer, or co-extruding the nanovoided polymer layer and the solid polymer layer to form a multilayer structure. The deposition of the nanovoided polymer layer may include using a deposition process including at least one of the following: spin coating, printing, chemical vapor deposition, vapor coating, transfer of a prefabricated nanovoided polymer layer, dipping, or spraying. The method may be a method of fabricating a device such as a sensor and/or actuator.

Example 20. The method of Example 19, further comprising forming a first electrode and a second electrode on the multilayer structure so that at least part of the multilayer structure is located between the first electrode and the second electrode.

Embodiments of the present disclosure may include or be implemented in conjunction with various types of artificial reality systems. Artificial reality is a form of reality that has been adjusted in some manner before presentation to a user, which may include, for example, a virtual reality, an augmented reality, a mixed reality, a hybrid reality, or some combination and/or derivative thereof. Artificial-reality content may include completely generated content or generated content combined with captured (e.g., real-world) content. The artificial-reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., to perform activities in) an artificial reality.

Artificial-reality systems may be implemented in a variety of different form factors and configurations. Some artificial reality systems may be designed to work without near-eye displays (NEDs), an example of which is augmented-reality system 1100 in FIG. 11. Other artificial reality systems may include a NED that also provides visibility into the real world (e.g., augmented-reality system 1200 in FIG. 12) or that visually immerses a user in an artificial reality (e.g., virtual-reality system 1300 in FIG. 13). While some artificial-reality devices may be self-contained systems, other artificial-reality devices may communicate and/or coordinate with external devices to provide an artificial-reality experience to a user. Examples of such external devices include handheld controllers, mobile devices, desktop computers, devices worn by a user, devices worn by one or more other users, and/or any other suitable external system.

Figure 11:
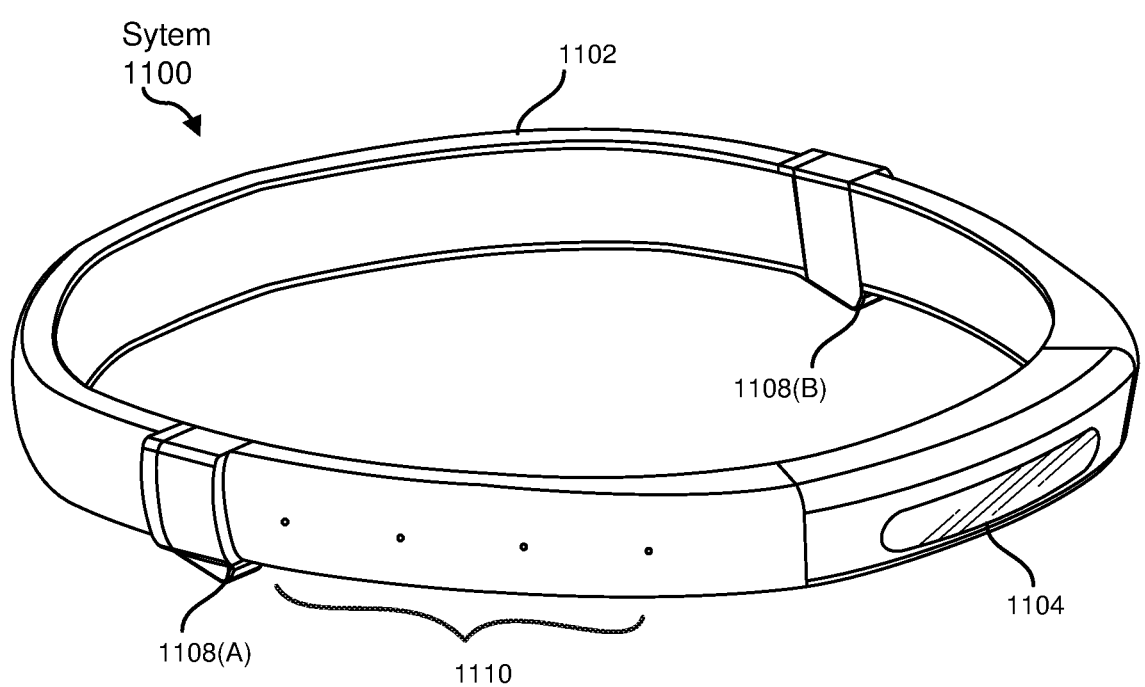
FIG. 11 is an illustration of an exemplary artificial-reality headband that may be used in connection with embodiments of this disclosure.

Turning to FIG. 11, augmented-reality system 1100 generally represents a wearable device dimensioned to fit about a body part (e.g., a head) of a user. As shown in FIG. 11, system 1100 may include a frame 1102 and a camera assembly 1104 that is coupled to frame 1102 and configured to gather information about a local environment by observing the local environment. Augmented-reality system 1100 may also include one or more audio devices, such as output audio transducers 1108(A) and 1108(B) and input audio transducers 1110. Output audio transducers 1108(A) and 1108(B) may provide audio feedback and/or content to a user, and input audio transducers 1110 may capture audio in a user's environment.

As shown, augmented-reality system 1100 may not necessarily include a NED positioned in front of a user's eyes. Augmented-reality systems without NEDs may take a variety of forms, such as head bands, hats, hair bands, belts, watches, wrist bands, ankle bands, rings, neckbands, necklaces, chest bands, eyewear frames, and/or any other suitable type or form of apparatus. While augmented-reality system 1100 may not include a NED, augmented-reality system 1100 may include other types of screens or visual feedback devices (e.g., a display screen integrated into a side of frame 1102).

Figure 12:
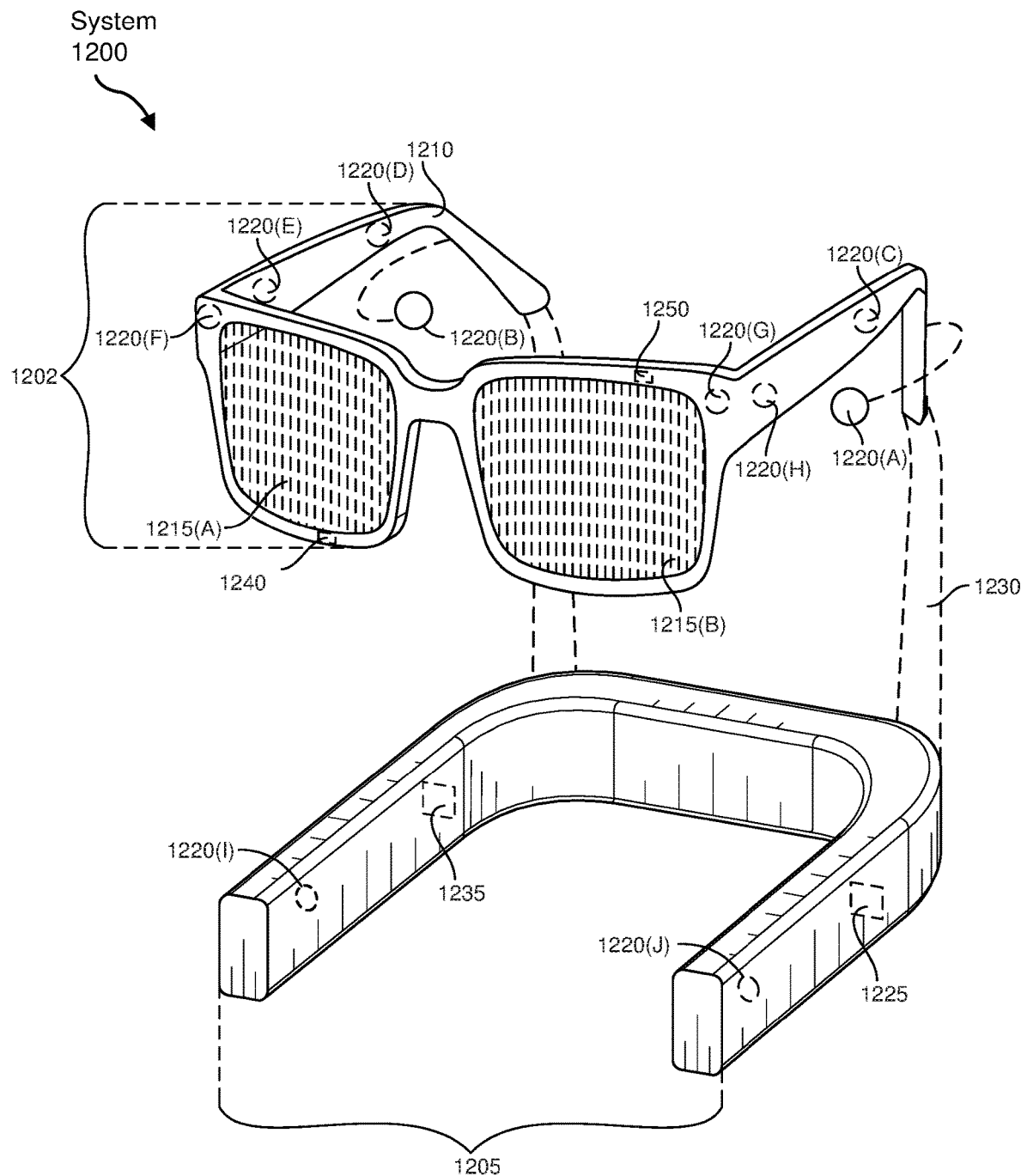
FIG. 12 is an illustration of exemplary augmented-reality glasses that may be used in connection with embodiments of this disclosure.

The embodiments discussed in this disclosure may also be implemented in augmented-reality systems that include one or more NEDs. For example, as shown in FIG. 12, augmented-reality system 1200 may include an eyewear device 1202 with a frame 1210 configured to hold a left display device 1215(A) and a right display device 1215(B) in front of a user's eyes. Display devices 1215(A) and 1215(B) may act together or independently to present an image or series of images to a user. While augmented-reality system 1200 includes two displays, embodiments of this disclosure may be implemented in augmented-reality systems with a single NED or more than two NEDs.

In some embodiments, augmented-reality system 1200 may include one or more sensors, such as sensor 1240. Sensor 1240 may generate measurement signals in response to motion of augmented-reality system 1200 and may be located on substantially any portion of frame 1210. Sensor 1240 may represent a position sensor, an inertial measurement unit (IMU), a depth camera assembly, or any combination thereof. In some embodiments, augmented-reality system 1200 may or may not include sensor 1240 or may include more than one sensor. In embodiments in which sensor 1240 includes an IMU, the IMU may generate calibration data based on measurement signals from sensor 1240. Examples of sensor 1240 may include, without limitation, accelerometers, gyroscopes, magnetometers, other suitable types of sensors that detect motion, sensors used for error correction of the IMU, or some combination thereof. Augmented-reality system 1200 may also include a microphone array with a plurality of acoustic transducers 1220(A)-1220(J), referred to collectively as acoustic transducers 1220. Acoustic transducers 1220 may be transducers that detect air pressure variations induced by sound waves. Each acoustic transducer 1220 may be configured to detect sound and convert the detected sound into an electronic format (e.g., an analog or digital format). The microphone array in FIG. 2 may include, for example, ten acoustic transducers: 1220(A) and 1220(B), which may be designed to be placed inside a corresponding ear of the user, acoustic transducers 1220(C), 1220(D), 1220(E), 1220(F), 1220(G), and 1220 (H), which may be positioned at various locations on frame 1210, and/or acoustic transducers 1220(1) and 1220(J), which may be positioned on a corresponding neckband 1205.

In some embodiments, one or more of acoustic transducers 1220(A)-(F) may be used as output transducers (e.g., speakers). For example, acoustic transducers 1220(A) and/or 1220(B) may be earbuds or any other suitable type of headphone or speaker.

The configuration of acoustic transducers 1220 of the microphone array may vary. While augmented-reality system 1200 is shown in FIG. 12 as having ten acoustic transducers 1220, the number of acoustic transducers 1220 may be greater or less than ten. In some embodiments, using higher numbers of acoustic transducers 1220 may increase the amount of audio information collected and/or the sensitivity and accuracy of the audio information. In contrast, using a lower number of acoustic transducers 1220 may decrease the computing power required by the controller 1250 to process the collected audio information. In addition, the position of each acoustic transducer 1220 of the microphone array may vary. For example, the position of an acoustic transducer 1220 may include a defined position on the user, a defined coordinate on frame 1210, an orientation associated with each acoustic transducer, or some combination thereof.

Acoustic transducers 1220(A) and 1220(B) may be positioned on different parts of the user's ear, such as behind the pinna or within the auricle or fossa. Or, there may be additional acoustic transducers on or surrounding the ear in addition to acoustic transducers 1220 inside the ear canal. Having an acoustic transducer positioned next to an ear canal of a user may enable the microphone array to collect information on how sounds arrive at the ear canal. By positioning at least two of acoustic transducers 1220 on either side of a user's head (e.g., as binaural microphones), augmented-reality device 1200 may simulate binaural hearing and capture a 3D stereo sound field around about a user's head. In some embodiments, acoustic transducers 1220(A) and 1220(B) may be connected to augmented-reality system 1200 via a wired connection 1230, and in other embodiments, acoustic transducers 1220(A) and 1220(B) may be connected to augmented-reality system 1200 via a wireless connection (e.g., a Bluetooth connection). In still other embodiments, acoustic transducers 1220(A) and 1220(B) may not be used at all in conjunction with augmented-reality system 1200.

Acoustic transducers 1220 on frame 1210 may be positioned along the length of the temples, across the bridge, above or below display devices 1215(A) and 1215(B), or some combination thereof. Acoustic transducers 1220 may be oriented such that the microphone array is able to detect sounds in a wide range of directions surrounding the user wearing the augmented-reality system 1200. In some embodiments, an optimization process may be performed during manufacturing of augmented-reality system 1200 to determine relative positioning of each acoustic transducer 1220 in the microphone array.

In some examples, augmented-reality system 1200 may include or be connected to an external device (e.g., a paired device), such as neckband 1205. Neckband 1205 generally represents any type or form of paired device. Thus, the following discussion of neckband 1205 may also apply to various other paired devices, such as charging cases, smart watches, smart phones, wrist bands, other wearable devices, hand-held controllers, tablet computers, laptop computers and other external compute devices, etc.

As shown, neckband 1205 may be coupled to eyewear device 1202 via one or more connectors. The connectors may be wired or wireless and may include electrical and/or non-electrical (e.g., structural) components. In some cases, eyewear device 1202 and neckband 1205 may operate independently without any wired or wireless connection between them. While FIG. 12 illustrates the components of eyewear device 1202 and neckband 1205 in example locations on eyewear device 1202 and neckband 1205, the components may be located elsewhere and/or distributed differently on eyewear device 1202 and/or neckband 1205. In some embodiments, the components of eyewear device 1202 and neckband 1205 may be located on one or more additional peripheral devices paired with eyewear device 1202, neckband 1205, or some combination thereof. Furthermore, Pairing external devices, such as neckband 1205, with augmented-reality eyewear devices may enable the eyewear devices to achieve the form factor of a pair of glasses while still providing sufficient battery and computation power for expanded capabilities. Some or all of the battery power, computational resources, and/or additional features of augmented-reality system 1200 may be provided by a paired device or shared between a paired device and an eyewear device, thus reducing the weight, heat profile, and form factor of the eyewear device overall while still retaining desired functionality. For example, neckband 1205 may allow components that would otherwise be included on an eyewear device to be included in neckband 1205 since users may tolerate a heavier weight load on their shoulders than they would tolerate on their heads. Neckband 1205 may also have a larger surface area over which to diffuse and disperse heat to the ambient environment. Thus, neckband 1205 may allow for greater battery and computation capacity than might otherwise have been possible on a stand-alone eyewear device. Since weight carried in neckband 1205 may be less invasive to a user than weight carried in eyewear device 1202, a user may tolerate wearing a lighter eyewear device and carrying or wearing the paired device for greater lengths of time than a user would tolerate wearing a heavy stand-alone eyewear device, thereby enabling users to more fully incorporate artificial reality environments into their day-to-day activities.

Neckband 1205 may be communicatively coupled with eyewear device 1202 and/or to other devices. These other devices may provide certain functions (e.g., tracking, localizing, depth mapping, processing, storage, etc.) to augmented-reality system 1200. In the embodiment of FIG. 12, neckband 1205 may include two acoustic transducers (e.g., 1220(1) and 1220(J)) that are part of the microphone array (or potentially form their own microphone subarray). Neckband 1205 may also include a controller 1225 and a power source 1235.

Acoustic transducers 1220(1) and 1220(J) of neckband 1205 may be configured to detect sound and convert the detected sound into an electronic format (analog or digital). In the embodiment of FIG. 12, acoustic transducers 1220(1) and 1220(J) may be positioned on neckband 1205, thereby increasing the distance between the neckband acoustic transducers 1220(1) and 1220(J) and other acoustic transducers 1220 positioned on eyewear device 1202. In some cases, increasing the distance between acoustic transducers 1220 of the microphone array may improve the accuracy of beamforming performed via the microphone array. For example, if a sound is detected by acoustic transducers 1220(C) and 1220(D) and the distance between acoustic transducers 1220(C) and 1220(D) is greater than, e.g., the distance between acoustic transducers 1220(D) and 1220(E), the determined source location of the detected sound may be more accurate than if the sound had been detected by acoustic transducers 1220(D) and 1220(E).

Controller 1225 of neckband 1205 may process information generated by the sensors on 1205 and/or augmented-reality system 1200. For example, controller 1225 may process information from the microphone array that describes sounds detected by the microphone array. For each detected sound, controller 1225 may perform a direction-of-arrival (DOA) estimation to estimate a direction from which the detected sound arrived at the microphone array. As the microphone array detects sounds, controller 1225 may populate an audio data set with the information. In embodiments in which augmented-reality system 1200 includes an inertial measurement unit, controller 1225 may compute all inertial and spatial calculations from the IMU located on eyewear device 1202. A connector may convey information between augmented-reality system 1200 and neckband 1205 and between augmented-reality system 1200 and controller 1225. The information may be in the form of optical data, electrical data, wireless data, or any other transmittable data form. Moving the processing of information generated by augmented-reality system 1200 to neckband 1205 may reduce weight and heat in eyewear device 1202, making it more comfortable to the user.

Power source 1235 in neckband 1205 may provide power to eyewear device 1202 and/or to neckband 1205. Power source 1235 may include, without limitation, lithium ion batteries, lithium-polymer batteries, primary lithium batteries, alkaline batteries, or any other form of power storage. In some cases, power source 1235 may be a wired power source. Including power source 1235 on neckband 1205 instead of on eyewear device 1202 may help better distribute the weight and heat generated by power source 1235.

As noted, some artificial reality systems may, instead of blending an artificial reality with actual reality, substantially replace one or more of a user's sensory perceptions of the real world with a virtual experience. One example of this type of system is a head-worn display system, such as virtual-reality system 1300 in FIG. 13, that mostly or completely covers a user's field of view. Virtual-reality system 1300 may include a front rigid body 1302 and a band 1304 shaped to fit around a user's head. Virtual-reality system 1300 may also include output audio transducers 1306(A) and 1306(B). Furthermore, while not shown in FIG. 13, front rigid body 1302 may include one or more electronic elements, including one or more electronic displays, one or more inertial measurement units (IMUS), one or more tracking emitters or detectors, and/or any other suitable device or system for creating an artificial reality experience.

Artificial reality systems may include a variety of types of visual feedback mechanisms. For example, display devices in augmented-reality system 1300 and/or virtual-reality system 1300 may include one or more liquid crystal displays (LCDs), light emitting diode (LED) displays, organic LED (OLED) displays, and/or any other suitable type of display screen. Artificial reality systems may include a single display screen for both eyes or may provide a display screen for each eye, which may allow for additional flexibility for varifocal adjustments or for correcting a user's refractive error. Some artificial reality systems may also include optical subsystems having one or more lenses (e.g., conventional concave or convex lenses, Fresnel lenses, adjustable liquid lenses, etc.) through which a user may view a display screen.

In addition to or instead of using display screens, some artificial reality systems may include one or more projection systems. For example, display devices in augmented-reality system 1200 and/or virtual-reality system 1300 may include micro-LED projectors that project light (using, e.g., a waveguide) into display devices, such as clear combiner lenses that allow ambient light to pass through. The display devices may refract the projected light toward a user's pupil and may enable a user to simultaneously view both artificial reality content and the real world. Artificial reality systems may also be configured with any other suitable type or form of image projection system.

Artificial reality systems may also include various types of computer vision components and subsystems. For example, augmented-reality system 1100, augmented-reality system 1200, and/or virtual-reality system 1300 may include one or more optical sensors, such as two-dimensional (2D) or three-dimensional (3D) cameras, time-of-flight depth sensors, single-beam or sweeping laser rangefinders, 3D LiDAR sensors, and/or any other suitable type or form of optical sensor. An artificial reality system may process data from one or more of these sensors to identify a location of a user, to map the real world, to provide a user with context about real-world surroundings, and/or to perform a variety of other functions.

Artificial reality systems may also include one or more input and/or output audio transducers. In the examples shown in FIGS. 11 and 13, output audio transducers 1108 (A), 1108(B), 1306(A), and 1306(B) may include voice coil speakers, ribbon speakers, electrostatic speakers, piezoelectric speakers, bone conduction transducers, cartilage conduction transducers, and/or any other suitable type or form of audio transducer. Similarly, input audio transducers 1110 may include condenser microphones, dynamic microphones, ribbon microphones, and/or any other type or form of input transducer. In some embodiments, a single transducer may be used for both audio input and audio output.

Figure 13:
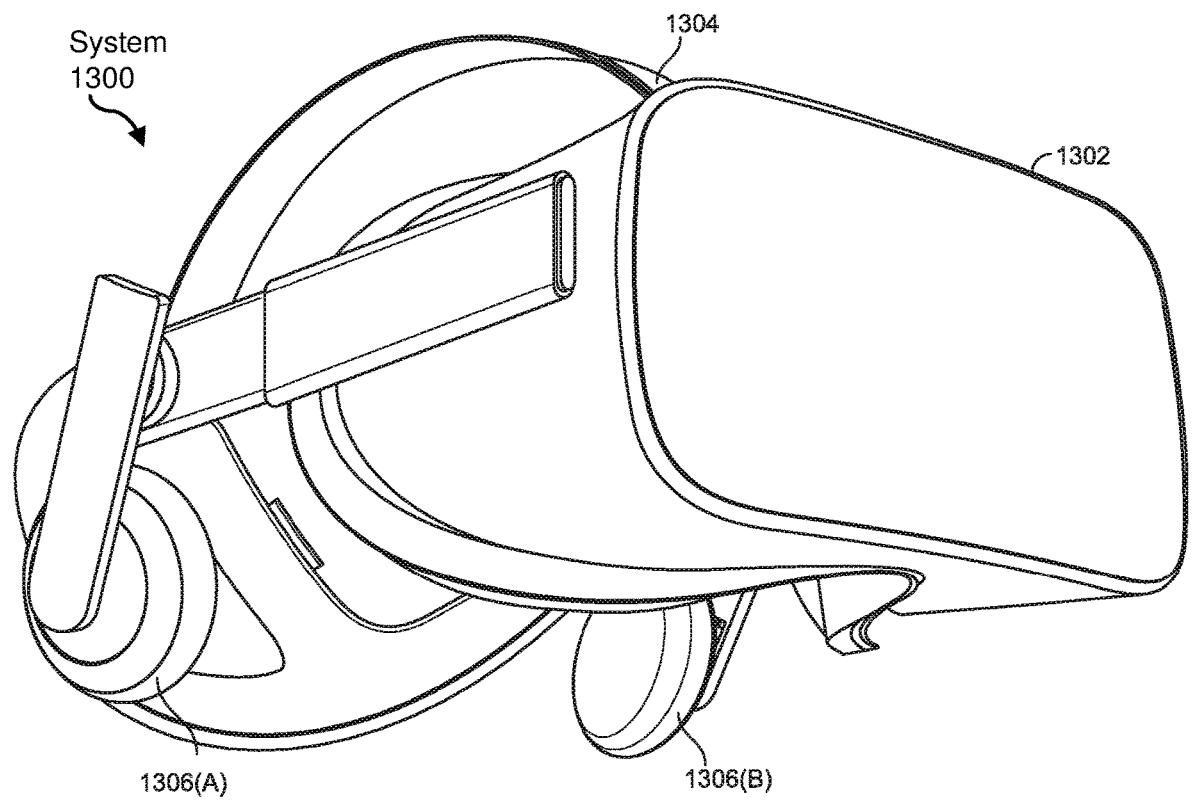
FIG. 13 is an illustration of an exemplary virtual-reality headset that may be used in connection with embodiments of this disclosure.

While not shown in FIGS. 11-13, artificial reality systems may include tactile (i.e., haptic) feedback systems, which may be incorporated into headwear, gloves, body suits, handheld controllers, environmental devices (e.g., chairs, floormats, etc.), and/or any other type of device or system. Haptic feedback systems may provide various types of cutaneous feedback, including vibration, force, traction, texture, and/or temperature. Haptic feedback systems may also provide various types of kinesthetic feedback, such as motion and compliance. Haptic feedback may be implemented using motors, piezoelectric actuators, fluidic systems, and/or a variety of other types of feedback mechanisms. Haptic feedback systems may be implemented independent of other artificial reality devices, within other artificial reality devices, and/or in conjunction with other artificial reality devices.

By providing haptic sensations, audible content, and/or visual content, artificial reality systems may create an entire virtual experience or enhance a user's real-world experience in a variety of contexts and environments. For instance, artificial reality systems may assist or extend a user's perception, memory, or cognition within a particular environment. Some systems may enhance a user's interactions with other people in the real world or may enable more immersive interactions with other people in a virtual world. Artificial reality systems may also be used for educational purposes (e.g., for teaching or training in schools, hospitals, government organizations, military organizations, business enterprises, etc.), entertainment purposes (e.g., for playing video games, listening to music, watching video content, etc.), and/or for accessibility purposes (e.g., as hearing aids, visuals aids, etc.). The embodiments disclosed herein may enable or enhance a user's artificial reality experience in one or more of these contexts and environments and/or in other contexts and environments.

As noted, artificial reality systems may be used with a variety of other types of devices to provide a more compelling artificial reality experience. These devices may be haptic interfaces with transducers that provide haptic feedback and/or that collect haptic information about a user's interaction with an environment. The artificial-reality systems disclosed herein may include various types of haptic interfaces that detect or convey various types of haptic information, including tactile feedback (e.g., feedback that a user detects via nerves in the skin, which may also be referred to as cutaneous feedback) and/or kinesthetic feedback (e.g., feedback that a user detects via receptors located in muscles, joints, and/or tendons).

Figure 14:
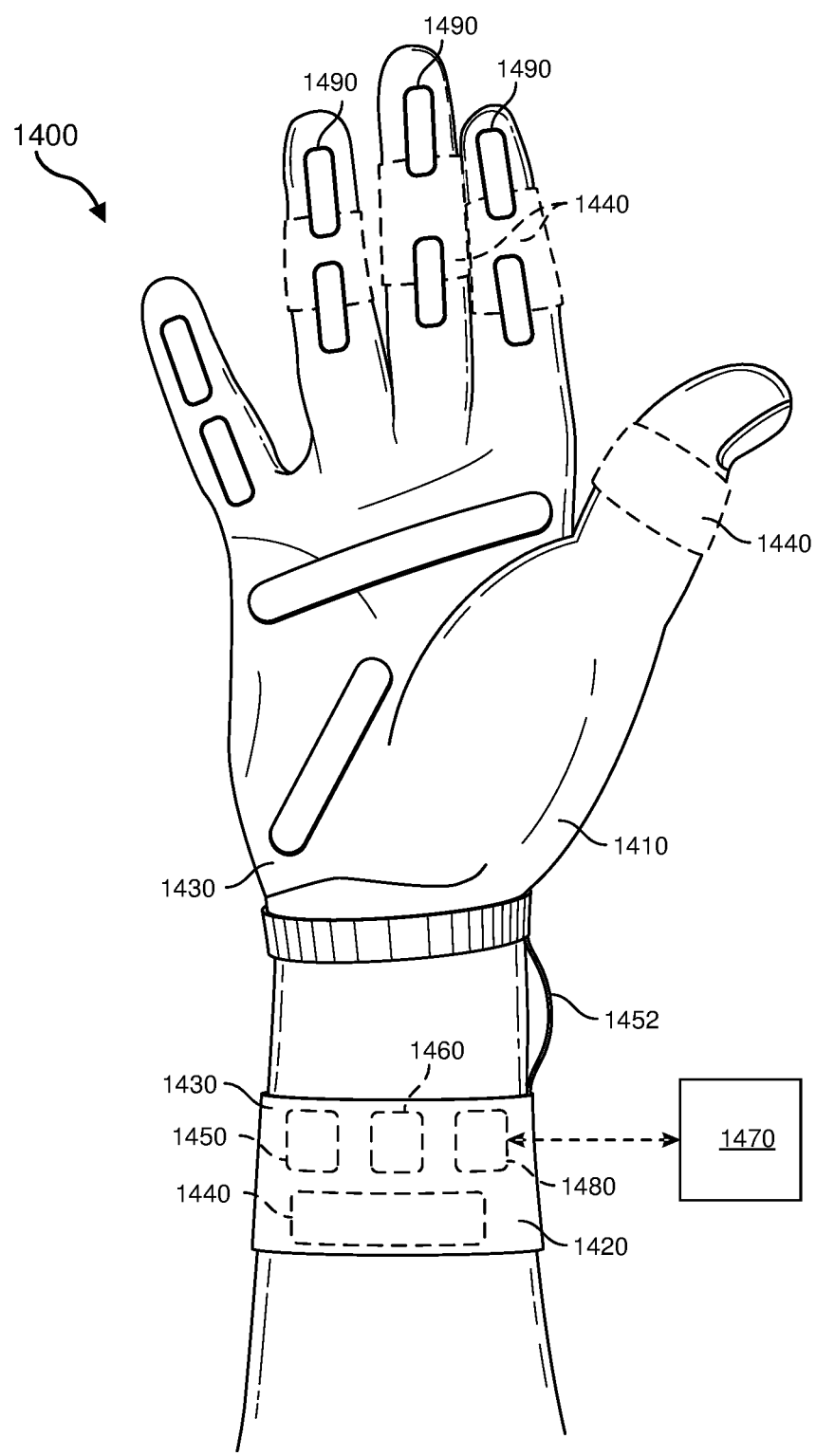
FIG. 14 is an illustration of exemplary haptic devices that may be used in connection with embodiments of this disclosure.

Haptic feedback may be provided by interfaces positioned within a user's environment (e.g., chairs, tables, floors, etc.) and/or interfaces on articles that may be worn or carried by a user (e.g., gloves, wristbands, etc.). As an example, FIG. 14 illustrates a vibrotactile system 1400 in the form of a wearable glove (haptic device 1410) and wristband (haptic device 1420). Haptic device 1410 and haptic device 1420 are shown as examples of wearable devices that include a flexible, wearable textile material 1430 that is shaped and configured for positioning against a user's hand and wrist, respectively. This disclosure also includes vibrotactile systems that may be shaped and configured for positioning against other human body parts, such as a finger, an arm, a head, a torso, a foot, or a leg. By way of example and not limitation, vibrotactile systems according to various embodiments of the present disclosure may also be in the form of a glove, a headband, an armband, a sleeve, a head covering, a sock, a shirt, or pants, among other possibilities. In some examples, the term "textile" may include any flexible, wearable material, including woven fabric, non-woven fabric, leather, cloth, a flexible polymer material, composite materials, etc.

One or more vibrotactile devices 1440 may be positioned at least partially within one or more corresponding pockets formed in textile material 1430 of vibrotactile system 1400. Vibrotactile devices 1440 may be positioned in locations to provide a vibrating sensation (e.g., haptic feedback) to a user of vibrotactile system 1400. For example, vibrotactile devices 1440 may be positioned to be against the user's finger(s), thumb, or wrist, as shown in FIG. 14. Vibrotactile devices 1440 may, in some examples, be sufficiently flexible to conform to or bend with the user's corresponding body part(s).

A power source 1450 (e.g., a battery) for applying a voltage to the vibrotactile devices 1440 for activation thereof may be electrically coupled to vibrotactile devices 1440, such as via conductive wiring 1452. In some examples, each of vibrotactile devices 1440 may be independently electrically coupled to power source 1450 for individual activation. In some embodiments, a processor 1460 may be operatively coupled to power source 1450 and configured (e.g., programmed) to control activation of vibrotactile devices 1440.

Vibrotactile system 1400 may be implemented in a variety of ways. In some examples, vibrotactile system 1400 may be a standalone system with integral subsystems and components for operation independent of other devices and systems. As another example, vibrotactile system 1400 may be configured for interaction with another device or system 1470. For example, vibrotactile system 1400 may, in some examples, include a communications interface 1480 for receiving and/or sending signals to the other device or system 1470. The other device or system 1470 may be a mobile device, a gaming console, an artificial reality (e.g., virtual reality, augmented reality, mixed reality) device, a personal computer, a tablet computer, a network device (e.g., a modem, a router, etc.), a handheld controller, etc. Communications interface 1480 may enable communications between vibrotactile system 1400 and the other device or system 1470 via a wireless (e.g., Wi-Fi, Bluetooth, cellular, radio, etc.) link or a wired link. If present, communications interface 1480 may be in communication with processor 1460, such as to provide a signal to processor 1460 to activate or deactivate one or more of the vibrotactile devices 1440.

Vibrotactile system 1400 may optionally include other subsystems and components, such as touch-sensitive pads 1490, pressure sensors, motion sensors, position sensors, lighting elements, and/or user interface elements (e.g., an on/off button, a vibration control element, etc.). During use, vibrotactile devices 1440 may be configured to be activated for a variety of different reasons, such as in response to the user's interaction with user interface elements, a signal from the motion or position sensors, a signal from the touch-sensitive pads 1490, a signal from the pressure sensors, a signal from the other device or system 1470, etc.

Although power source 1450, processor 1460, and communications interface 1480 are illustrated in FIG. 14 as being positioned in haptic device 1420, the present disclosure is not so limited. For example, one or more of power source 1450, processor 1460, or communications interface 1480 may be positioned within haptic device 1410 or within another wearable textile.

Figure 15:
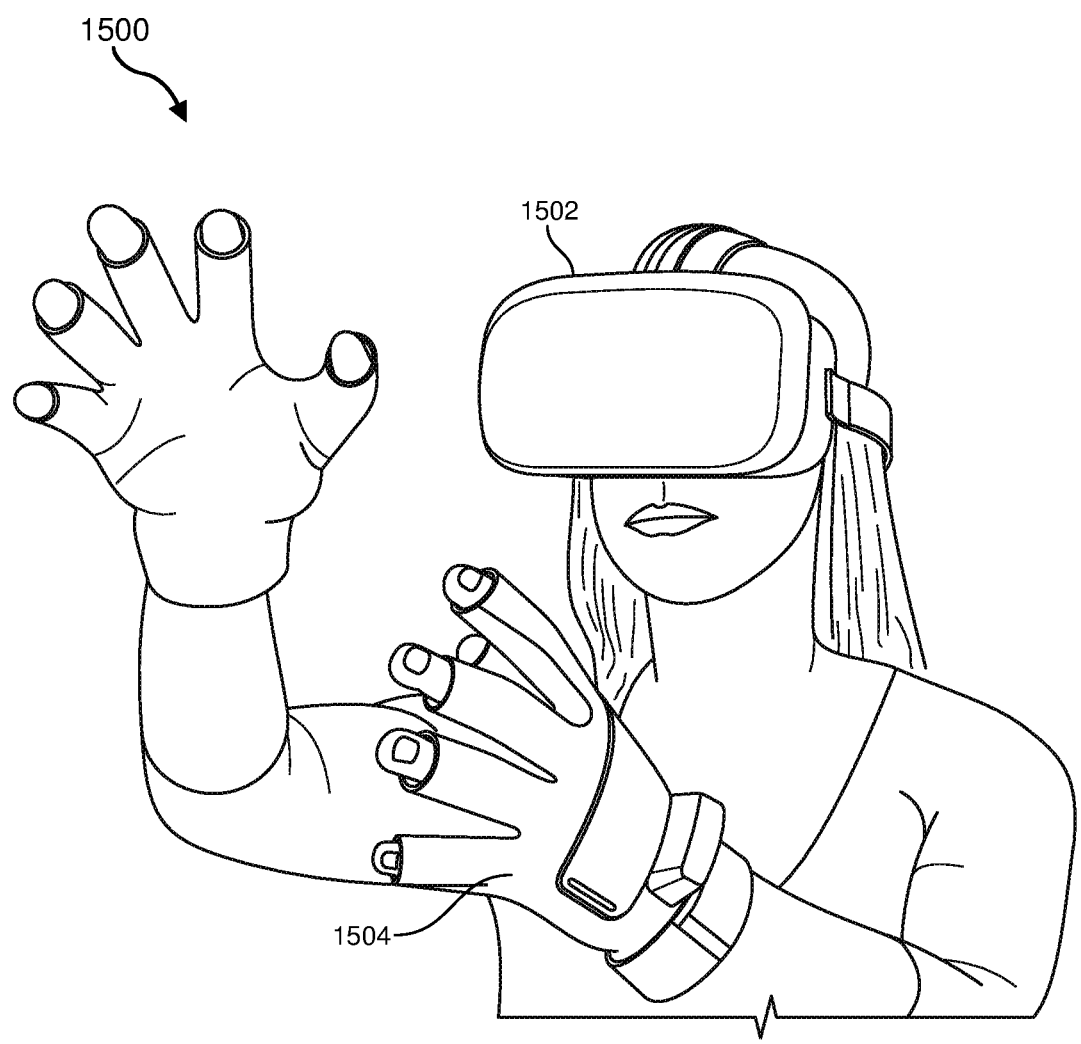
FIG. 15 is an illustration of an exemplary virtual-reality environment according to embodiments of this disclosure.

Haptic wearables, such as those shown in and described in connection with FIG. 14, may be implemented in a variety of types of artificial-reality systems and environments. FIG. 15 shows an example artificial reality environment 1500 including one head-mounted virtual-reality display and two haptic devices (i.e., gloves), and in other embodiments any number and/or combination of these components and other components may be included in an artificial reality system. For example, in some embodiments there may be multiple head-mounted displays each having an associated haptic device, with each head-mounted display and each haptic device communicating with the same console, portable computing device, or other computing system.

Head-mounted display 1502 generally represents any type or form of virtual-reality system, such as virtual-reality system 1300 in FIG. 13. Haptic device 1504 generally represents any type or form of wearable device, worn by a use of an artificial reality system, that provides haptic feedback to the user to give the user the perception that he or she is physically engaging with a virtual object. In some embodiments, haptic device 1504 may provide haptic feedback by applying vibration, motion, and/or force to the user. For example, haptic device 1504 may limit or augment a user's movement. To give a specific example, haptic device 1504 may limit a user's hand from moving forward so that the user has the perception that his or her hand has come in physical contact with a virtual wall. In this specific example, one or more actuators within the haptic advice may achieve the physical-movement restriction by pumping fluid into an inflatable bladder of the haptic device. In some examples, a user may also use haptic device 1504 to send action requests to a console. Examples of action requests include, without limitation, requests to start an application and/or end the application and/or requests to perform a particular action within the application.

Figure 16:
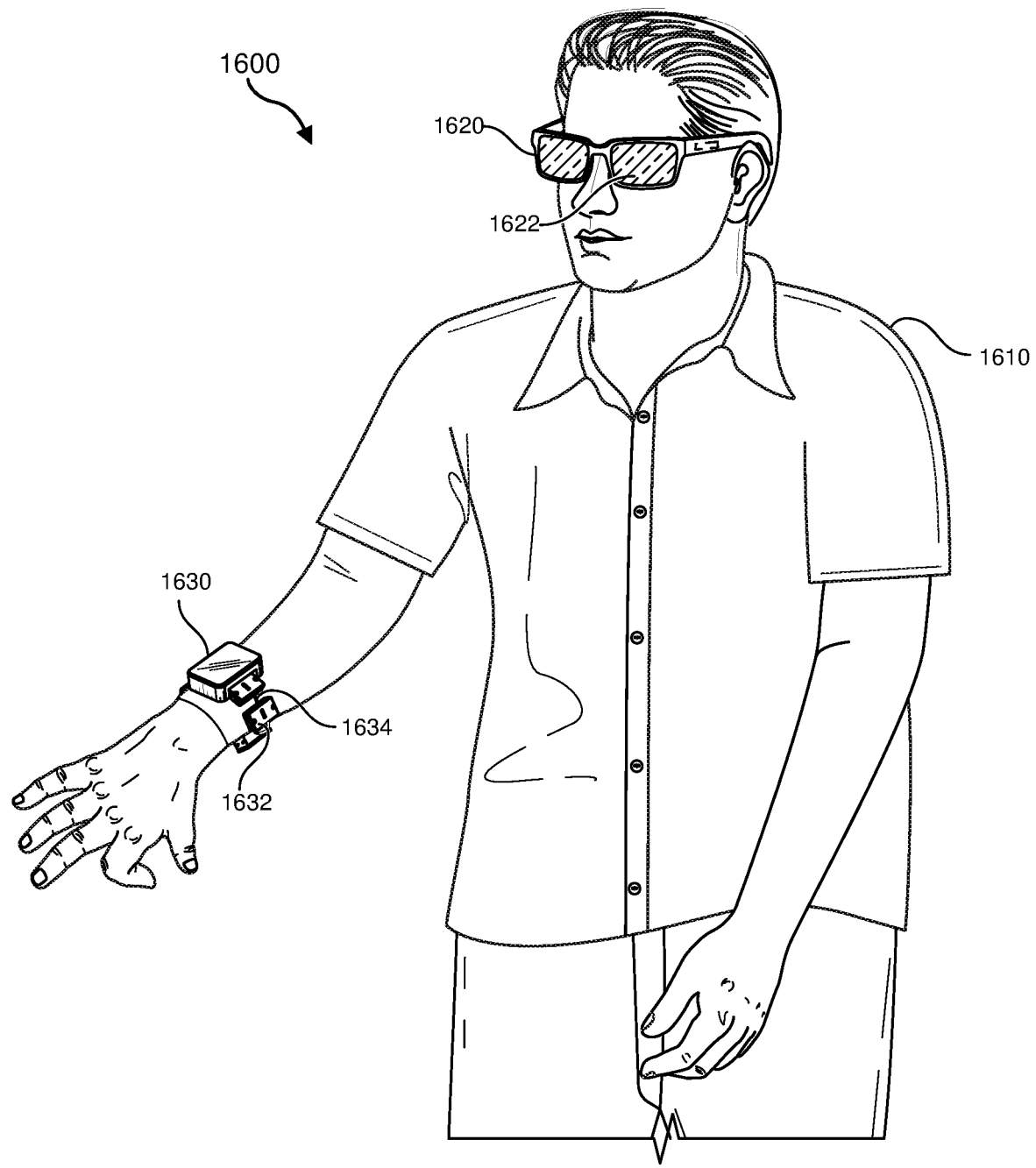
FIG. 16 is an illustration of an exemplary augmented-reality environment according to embodiments of this disclosure.

While haptic interfaces may be used with virtual-reality systems, as shown in FIG. 15, haptic interfaces may also be used with augmented-reality systems, as shown in FIG. 16. FIG. 16 is a perspective view a user 1610 interacting with an augmented-reality system 1600. In this example, user 1610 may wear a pair of augmented-reality glasses 1620 that have one or more displays 1622 and that are paired with a haptic device 1630. Haptic device 1630 may be a wristband that includes a plurality of band elements 1632 and a tensioning mechanism 1634 that connects band elements 1632 to one another.

One or more of band elements 1632 may include any type or form of actuator suitable for providing haptic feedback. For example, one or more of band elements 1632 may be configured to provide one or more of various types of cutaneous feedback, including vibration, force, traction, texture, and/or temperature. To provide such feedback, band elements 1632 may include one or more of various types of actuators. In one example, each of band elements 1632 may include a vibrotactor (e.g., a vibrotactile actuator) configured to vibrate in unison or independently to provide one or more of various types of haptic sensations to a user. Alternatively, only a single band element or a subset of band elements may include vibrotactors.

Haptic devices 1410, 1420, 1504, and 1630 may include any suitable number and/or type of haptic transducer, sensor, and/or feedback mechanism. For example, haptic devices 1410, 1420, 1504, and 1630 may include one or more mechanical transducers, piezoelectric transducers, and/or fluidic transducers. Haptic devices 1410, 1420, 1504, and 1630 may also include various combinations of different types and forms of transducers that work together or independently to enhance a user's artificial-reality experience. In one example, each of band elements 1632 of haptic device 1630 may include a vibrotactor (e.g., a vibrotactile actuator) configured to vibrate in unison or independently to provide one or more of various types of haptic sensations to a user.

Further Examples

In some applications, an electroactive device used in connection with the principles disclosed herein may include a first electrode, a second electrode, and an electroactive element disposed between the first electrode and the second electrode. The electroactive element may include an electroactive polymer and a plurality of voids distributed within the electroactive polymer, for example as a porous polymer structure. Voids may be generally isolated from each other, or, at least in part, be interconnected through an open-cell structure. The plurality of voids may have a non-uniform distribution within the electroactive polymer, and the electroactive element may have a non-uniform electroactive response when an electrical signal is applied between the first electrode and the second electrode, based on the non-uniform distribution of voids.

A non-uniform distribution of the plurality of voids may include a spatial variation in at least one of void diameter, void volume, void number density, void volume fraction, or void orientation (e.g., in the case of anisotropic voids). Voids may include a non-polymeric material. Voids may include at least one of a gas, a liquid, a gel, a foam, or a non-polymeric solid. A non-uniform electroactive response may include a first deformation of a first portion of the electroactive element that differs from a second deformation of a second portion of the electroactive element. A deformation may include a compression (e.g., parallel to an applied electric field), change in curvature, or other change in a dimensional parameter, such as length, width, height, and the like, in one or more directions. An electroactive device may have a first deformation on application of a first voltage between the first and second electrodes, and a second deformation on application of a second voltage between the first and second electrodes, with the first and second deformations being appreciably different. An electrical signal may include a potential difference, which may include a direct or alternating voltage. The frequency of alternating voltage may be selected to provide an appreciable haptic sensation on the skin of a wearer. In some embodiments, the frequency may be higher than the highest mechanical response frequency of the device, so that deformation may occur in response to the applied r.m.s. electric field but with no appreciable oscillatory mechanical response to the applied frequency. The applied electrical signal may generate non-uniform constriction of the electroactive element between the first and second electrodes. A non-uniform electroactive response may include a curvature of a surface of the electroactive element, which may in some embodiments be a compound curvature.

In some embodiments, an electroactive device may include an optical element mechanically coupled to the electroactive element. An optical element may include at least one of a lens, a grating, a prism, a mirror, or a diffraction grating. In some embodiments, the electroactive device may be a component of a wearable device. The wearable device may include a helmet or other headwear, an eyewear frame, a glove, a belt, or any device configured to be positioned adjacent to or proximate the body of a wearer, for example to support the electroactive device proximate a user when the user wears the wearable device, and the electroactive device may be configured to provide a tactile signal to the user. In some embodiments, an electroactive device includes a first electrode, a second electrode, and an electroactive element located between the first electrode and the second electrode. The electroactive element may include an electroactive polymer and a plurality of voids having a non-uniform distribution within the electroactive element. Application of a mechanical input to a portion of the electroactive element generates an electric signal between the first electrode and the second electrode. The electrical response to a mechanical variation may vary over the electroactive device, with the magnitude being determined, at least in part, by the location of the mechanical input relative to the non-uniform distribution of voids within the electroactive element. The electroactive element may include a first portion and a second portion, and a first voltage generated by a mechanical input to the first portion is appreciably different from a second voltage generated by a similar mechanical input to the second portion.

The electroactive device may be a component of a wearable device, configured to be worn by a user. The wearable device may be configured to support the electroactive device against a body portion of the user. The electroactive device may be configured to provide an electrical signal correlated with a configuration of the body part, such as a configuration of a body part, such as a joint angle. For example, the electrical signal may be used to determine a joint angle of a finger portion, wrist, elbow, knee, ankle, toe, or other body joint, or the bend angle of a mechanical device. For example, the wearable device may be a glove, and the electroactive device may be configured to provide an electrical signal based, at least in part, on a joint angle within a hand of the user, such as the angle between portions of a finger. In some embodiments, a method includes generating an electroactive response in an electroactive device, the electroactive device including an electroactive element located between a first electrode and a second electrode, wherein the electroactive response to an electrical input or a mechanical input varies appreciably over a spatial extent of the electroactive device due to a non-uniform distribution of voids within the electroactive element.

In some embodiments, the electroactive response may include a mechanical response to the electrical input that varies over the spatial extent of the electroactive device, with the electrical input being applied between the first electrode and the second electrode. The mechanical response may be termed an actuation, and example devices may be or include actuators. In some embodiments, the electroactive response may include an electrical signal having a characteristic indicative of a location of the mechanical input to the electroactive device, the electrical signal being measured between the first electrode and the second electrode. The electrical signal may be a termed sensor signal, and in some embodiments, the electroactive device may be or include a sensor. In some embodiments, an electroactive device may be used as both an actuator and a sensor. In some embodiments, the electroactive device is supported against a hand of a user, and the electrical signal is used to determine a gesture by the user, the gesture including a finger movement. In some embodiments, typing inputs by a user, for example, into a virtual keyboard, may be determined from sensor signals.

In some embodiments, an electroactive device may include one or more electroactive elements, and an electroactive element may include one or more electroactive materials, which may include one or more electroactive polymer materials. In various embodiments, an electroactive device may include a first electrode, a second electrode overlapping at least a portion of the first electrode, and an electroactive element disposed between the first electrode and the second electrode. In some embodiments, the electroactive element may include an electroactive polymer. In some embodiments, an electroactive element may include an elastomer material, which may be a polymer elastomeric material. In some embodiments, the elastomer material may have a Poisson's ratio of approximately 0.35 or less. The electroactive element may be deformable from an initial state to a deformed state when a first voltage is applied between the first electrode and the second electrode, and may further be deformable to a second deformed state when a second voltage is applied between the first electrode and the second electrode.

In some embodiments, there may be one or more additional electrodes, and a common electrode may be electrically coupled to one or more of the additional electrodes. For example, electrodes and electroactive elements may be disposed in a stacked configuration, with a first common electrode coupled to a first plurality of electrodes, and a second common electrode electrically connected to a second plurality of electrodes. The first and second pluralities may alternate in a stacked configuration, so that each electroactive element is located between one of the first plurality of electrodes and one of the second plurality of electrodes.

In some embodiments, an electroactive element may have a maximum thickness in an undeformed state and a compressed thickness in a deformed state. In some embodiments, an electroactive element may have a density in an undeformed state that is approximately 90% or less of a density of the electroactive element in the deformed state. In some embodiments, an electroactive element may exhibit a strain of at least approximately 10% when a voltage is applied between the first electrode and the second electrode.

In some embodiments, an electroactive element may include at least one non-polymeric component in a plurality of defined regions and the method may further include removing at least a portion of the at least one non-polymeric component from the cured elastomer material to form a nanovoided polymer material.

In some embodiments, an electroactive device may include an electroactive polymer configured with a first location of patterned nanovoids such that the first location has a different transduction behavior from a second location having a second location of patterned nanovoids. In some embodiments, a global electric field applied over the entirety of an electroactive element generates differential deformation between the first and second locations.

An electroactive element may have a plurality of locations of patterned nanovoids such that when a first voltage is applied the EAP exhibits a predetermined compound curvature. The electroactive device may exhibit a second predetermined compound curvature, different from the first predetermined compound curvature, when a second voltage is applied. A wearable device may comprise an electroactive device, where the first compound curvature provides a first tactile feeling and the second compound curvature provides a second tactile feeling to a person when the person is wearing the wearable device. In some electrodes, the first electrode and/or the second electrode may be patterned, allowing a localized electric field to be applied to a portion of the device, for example to provide a localized compound curvature.

In some embodiments, a sensor may include an electroactive device, where the electroactive device comprises a first and a second portion, where the first portion has a different sensor response than the second portion due to a non-uniform distribution of patterned nanovoids. The sensor may be a wearable device. The sensor may be in electrical communication with a controller configured to determine a flexure of a wearable device based on the one or more electrical outputs from the wearable device. For example, the wearable device may comprise one or more electroactive devices configured as sensors. In some embodiments, a sensor may be configured to determine a joint position of a wearer of the sensor based on the one or more electrical signals from the sensor. The sensors may be part of a glove or other wearable device. In some embodiments, the sensor may include an arrangement of electroactive sensors and may be configured to determine keystrokes into a keyboard, where the keyboard may be a real or virtual keyboard.

A non-uniform distribution of voids within an electroactive element may include a functional dependence on a distance parameter, such as distance from an edge and/or center of an electroactive element. For example, an electroactive element may have a generally rectangular shape with a generally uniform thickness. In some embodiments, the volume fraction of voids may increase monotonically along a direction parallel to a longer side and/or a shorter side of the rectangular shape. In some examples, the void volume fraction may have a highest value in some portion of the electroactive element and decrease from the highest portion to portions with lower void volume fractions elsewhere, for example proximate an edge. In some examples, the void volume fraction may have a lowest value in some portion of the electroactive element and increase from the lowest portion to portions with higher void volume fractions elsewhere, for example proximate an edge of the electroactive element. In some examples, an electroactive element may have a generally disk shape. The volume fraction of voids may vary as a function of a radial distance from the disk center. In some embodiments, the volume fraction may be highest in a central portion of a disk-shaped electroactive element and decrease along a radial direction to an edge. In some embodiments, the volume fraction may be lowest in a central portion and increase along a radial direction to an edge. The variation in void volume fraction may have a functional relationship with a distance parameter, for example including one or more of a linear, quadratic, sinusoidal, undulating, parabolic, or other functional relationship with a distance parameter along one or more of the relevant distance parameters. For example, a distance parameter may be determined as the distance along an edge, obliquely across, from a center, or other distance measurement for a given electroactive element.

An electroactive element can convert deformations into electrical signals, such as proportional electrical signals that scale with a deformation parameter (such as applied pressure). An electroactive element may also receive an electrical signal that induces a deformation based on the electrical signal (e.g., based on the voltage squared or mean square voltage). An electroactive device may be a transducer, with a degree of deformation based on the electrical signal, and/or as a sensor providing an electrical signal based on a degree of deformation. The electroactive response may be mediated by the dielectric constant and elastic modulus of the electroactive element. Using a single homogeneous polymer film constrains the transducer response to a particular input electrical signal/output mechanical response across the device. In some embodiments, an electroactive device actuates and/or senses deformations as a function of position within a single device, without the need for complex electrode structures, facilitating electroactive devices (such as transducers and/or sensors) capable of spatially variable actuation and sensing responses, using a simple electrical architecture such as a pair of electrodes.

In some embodiments, a device may include a transducer that converts variations in a physical quantity into an electrical signal, and/or vice versa. In some embodiments, the electrical response of a transducer may be corelated with a location of a mechanical input. The process by which variations in a physical quantity transforms into an electrical signal, and/or vice versa, may be referred to as transduction. A transducer may include an electroactive element, such an electroactive polymer element. In some examples, an electroactive element may comprise an electroactive polymer with a distribution of voids formed therein.

In some embodiments, an electroactive element may include a distribution of voids. In some embodiments, a void may include a region filled with a different medium, such as a non-polymeric material, such as a gas such as air, or a liquid. A portion of the electroactive element may have a volume fraction of voids, which may be determined as the void volume within a portion of the electroactive element divided by the total volume of the portion of the electroactive element. In some embodiments, the void volume fraction may be a function of a distance parameter. For example, the void volume fraction may be a linear function of a distance from one edge of an electroactive element, for example increasing in a generally linear fashion from one side to another. In some examples, the volume void fraction may be a non-linear function of a distance parameter, such as a polynomial function (such as a quadratic function), a step function, a parabolic function, an undulating function, a sine function, or the like. A distance parameter may be a distance from an edge of an electroactive element. In some embodiments, an electroactive element may have a generally cuboid shape, for example having a length, width, and thickness, for example as determined along generally mutually orthogonal directions. The thickness of the electroactive element may be approximately equal to the electrode separation. In some embodiments, an electroactive element may have a disk shape, a wedge shape, an elongated form such as a rod, or other shape. A distance parameter may be (as appropriate) a distance along an edge (e.g., a distance from one side towards another side), a radial distance (e.g., a distance from a center or an edge of a disk-shaped form in a generally radial direction), or other distance measurement. In some embodiments, a volume void fraction may be a function of a distance parameter over a plurality of electroactive elements, for example including a plurality of electroactive elements having different mean void volume fractions (optionally having an appreciable internal variation of void volume fraction, or in some embodiments no appreciable internal variation of void volume fraction) arranged to obtain a desired variation of void volume fraction with distance across a plurality of electroactive elements.

In some embodiments, a system may include at least one physical processor, a physical memory including computer-executable instructions that, when executed by the physical processor, cause the physical processor to apply an electrical field across an electroactive device to obtain non-uniform actuation based on a non-uniform distribution of voids within an electroactive element of the electroactive device. In some embodiments, a system may include at least one physical processor, a physical memory including computer-executable instructions that, when executed by the physical processor, cause the physical processor to receive an electrical signal from an electroactive device, and to process the electrical signal to obtain a deformation parameter of the electroactive device, wherein the deformation parameter includes one or more of the following: a magnitude of a deformation, a location of a deformation, a bend angle, a gesture type (e.g., selected from a plurality of gesture types). The analysis of the electrical signal may be based at least in part on a non-uniform distribution of voids within an electroactive element of the electroactive device.

Electroactive Elements

In some embodiments, the electroactive elements described herein may include an elastomer having an effective Poisson's ratio of less than approximately 0.35 and an effective uncompressed density that is less than approximately 90% of the elastomer when densified. In some embodiments, the term "effective Poisson's ratio" may refer to the negative of the ratio of transverse strain (e.g., strain in a first direction) to axial strain (e.g., strain in a second direction) in a material. In some embodiments, the electroactive elements may include a nanovoided polymer material.

In the presence of an electrostatic field, an electroactive polymer may deform (e.g., compress, elongates, bend, etc.) according to the strength of that field. Generation of such a field may be accomplished, for example, by placing the electroactive polymer between two electrodes, each of which is at a different potential. As the potential difference (i.e., voltage difference) between the electrodes is increased (e.g., from zero potential) the amount of deformation may also increase, principally along electric field lines. This deformation may achieve saturation when a certain electrostatic field strength has been reached. With no electrostatic field, the electroactive polymer may be in its relaxed state undergoing no induced deformation, or stated equivalently, no induced strain, either internal or external.

In some embodiments, a polymer element may include an elastomer. As used herein, an "elastomer" may (in some examples) refer to a material, such as a polymer, with viscoelasticity (i.e., both viscosity and elasticity), relatively weak intermolecular forces, and generally low elastic modulus (a measure of the stiffness of a solid material) and high failure strain compared with other materials. In some embodiments, an electroactive polymer may include an elastomer material that has an effective Poisson's ratio of less than approximately 0.35 (e.g., less than approximately 0.3, less than approximately 0.25, less than approximately 0.2, less than approximately 0.15, less than approximately 0.1, less than approximately 0.05). In at least one example, the elastomer material may have an effective density that is less than approximately 90% (e.g., less than approximately 80%, less than approximately 70%, less than approximately 60%, less than approximately 50%, less than approximately 40%) of the elastomer when densified (e.g., when the elastomer is compressed, for example, by electrodes to make the elastomer more dense).

In some embodiments, an electroactive element may include an elastomer material, which may have a Poisson's ratio of approximately 0.35 or less. In some embodiments, an electroactive element may have a thickness of approximately 10 nm to approximately 10 µm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 200 nm, approximately 300 nm, approximately 400 nm, approximately 500 nm, approximately 600 nm, approximately 700 nm, approximately 800 nm, approximately 900 nm, approximately 1 µm, approximately 2 µm, approximately 3 µm, approximately 4 µm, approximately 5 µm, approximately 6 µm, approximately 7 µm, approximately 8

μm, approximately 9 μm, approximately 10 μm), with an example thickness of approximately 200 nm to approximately 500 nm.

An electroactive device may include a multilayer, such as a plurality of stacked layers. In some examples, each layer may include an electroactive element disposed between a pair of electrodes. In some examples, an electrode may be shared between layers; for example, a device may have alternating electrodes and electroactive elements located between neighboring pairs of electrodes. Various stacked configurations can be constructed in different geometries that alter the shape, alignment, and spacing between layers. Such complex arrangements can enable compression, extension, twisting, and/or bending when operating the electroactive device.

Electroactive Polymers

An electroactive element may include one or more electroactive polymers and may also include additional components. As used herein, "electroactive polymers" may (in some examples) refer to polymers that exhibit a change in size or shape when stimulated by an electric field. Some electroactive polymers may find limited applications due to a low breakdown voltage of the polymers with respect to the operating voltage used by electroactive devices (e.g., actuators) that use the polymers. Electroactive devices with reduced operating voltages and higher energy densities may be useful for many applications.

In some embodiments, an electroactive polymer may include a deformable polymer that may be symmetric with regard to electrical charge (e.g., polydimethylsiloxane (PDMS), acrylates, etc.) or asymmetric (e.g., poled polyvinylidene fluoride (PVDF) or its copolymers such as poly (vinylidenefluoride-co-trifluoroethylene) (PVDF-TrFE)). Additional examples of polymer materials forming electroactive polymer materials may include, without limitation, styrenes, polyesters, polycarbonates, epoxies, halogenated polymers, such as PVDF, copolymers of PVDF, such as PVDF-TrFE, silicone polymers, and/or any other suitable polymer materials. Such materials may have any suitable dielectric constant or relative permittivity, such as, for example, a dielectric constant ranging from approximately 2 to approximately 30.

The physical origin of the compressive nature of electroactive polymers in the presence of an electrostatic field (E-field), being the force created between opposite electric charges, is that of the Maxwell stress, which is expressed mathematically with the Maxwell stress tensor. The level of strain or deformation induced by a given E-field is dependent on the square of the E-field strength, the dielectric constant of the electroactive polymer, and on the elastic compliance of the material in question. Compliance in this case is the change of strain with respect to stress or, equivalently, in more practical terms, the change in displacement with respect to force.

Voids

In some embodiments, the electroactive elements described herein may include voids, such as nanovoids (e.g., having a plurality of voids and/or nanoscale-sized voids in an electroactive element including an electroactive polymer or composite thereof). In some embodiments, the nanovoids may occupy at least approximately 10% (e.g., approximately 10% by volume, approximately 20% by volume, approximately 30% by volume, approximately 40% by volume, approximately 50% by volume, approximately 60% by volume, approximately 70% by volume, approximately 80% by volume, approximately 90% by volume) of the volume of the electroactive elements. The voids and/or nanovoids may be either closed- or open-celled, or a mixture thereof. If they are open-celled, the void size may be the minimum average diameter of the cell. In some embodiments, the polymer layer may include a thermoset material and/or any other suitable material having an elastic modulus of less than approximately 10 GPa (e.g., approximately 0.5 GPa, approximately 1 GPa, approximately 2 GPa, approximately 3 GPa, approximately 4 GPa, approximately 5 GPa, approximately 6 GPa, approximately 7 GPa, approximately 8 GPa, approximately 9 GPa).

The voids and/or nanovoids may be any suitable size and, in some embodiments, the voids may approach the scale of the thickness of the polymer layer in the undeformed state. For example, the voids may be between approximately 10 nm to about equal to the gap between the paired two electrodes. In some embodiments, the voids may be between approximately 10 nm and approximately 1000 nm, such as between approximately 10 and approximately 200 nm (e.g., approximately 10 nm, approximately 20 nm, approximately 30 nm, approximately 40 nm, approximately 50 nm, approximately 60 nm, approximately 70 nm, approximately 80 nm, approximately 90 nm, approximately 100 nm, approximately 110 nm, approximately 120 nm, approximately 130 nm, approximately 140 nm, approximately 150 nm, approximately 160 nm, approximately 170 nm, approximately 180 nm, approximately 190 nm, approximately 200 nm, approximately 250 nm, approximately 300 nm, approximately 400 nm, approximately 500 nm, approximately 600 nm, approximately 700 nm, approximately 800 nm, approximately 900 nm, and/or approximately 1000 nm).

In some embodiments, the term "effective density," as used herein, may refer to a parameter that may be obtained using a test method where a uniformly thick layer of the elastomer may be placed between two flat and rigid circular plates. In some embodiments, the diameter of the elastomer material being compressed may be at least 100 times the thickness the elastomer material. The diameter of the elastomer material may be measured, then the plates may be pressed together to exert a pressure of at least approximately $1 \times 10^6$ Pa on the elastomer, and the diameter of the elastomer is remeasured. The effective density may be determined from an expression $DR=(D_{uncompressed}/D_{compressed})$, where DR may represent the effective density ratio, $D_{uncompressed}$ may represent the density of the uncompressed polymer, and $D_{compressed}$ may represent the density of the compressed polymer.

The density of voids within an electroactive element, or other dielectric material, may vary as a function of position. In some embodiments, the volume fraction of an electroactive component (or dielectric material) may vary between 10% and 60%. The structure of the voids may be interconnected (open cell) or the voids may be fully enclosed by suitable dielectric material (closed cell). The voids may be partially filled with a dielectric liquid or dielectric gas. The voids may be partially coated with a layer of suitable material. In some embodiments, a voided material (such as a porous material) may be fabricated using a templating agent, such as a material that directs the structural formation of pores or other structural elements of an electroactive element. A templating agent may be any phase of matter (solid, liquid, gas). In some embodiments, a templating agent is removed to produce a pore (or void).

Particles

In some embodiments, the electroactive elements described herein may include particles including a material having a high dielectric constant, with the particles having an average diameter between approximately 10 nm and approximately 1000 nm. In some embodiments, the material having the high dielectric constant may include barium titanate.

In some embodiments, an electroactive element may include one or more polymers, and may additionally include a plurality of particles. In some embodiments, an electroactive element may include particles of a material to assist the formation of voids, support voided regions, or both. Example particle materials include: a silicate, such as silica, including structures resulting from silica gels, fumed silica; a titanate, such as barium titanate; a metal oxide, such as a transition metal oxide, such as titanium dioxide; another oxide; composites or combinations thereof; or other particle material. The particles may have an average diameter between approximately 10 nm and approximately 1000 nm, and the particles may form branched or networked particles with average dimensions of between approximately 100 and approximately 10,000 nm.

In some embodiments, an electroactive element may include particles of a material having a high dielectric constant. In some embodiments, the particles may have an average diameter between approximately 10 nm and approximately 1000 nm. In some embodiments, the particle material may have a high dielectric constant. In some embodiments, the particle material may include a titanate, such as barium titanate ($BaTiO_3$), or other perovskite material such as other titanates.

Additionally or alternatively, any other suitable component may be added to the electroactive polymer material. For example, a ferroelectric material such as a titanate, for example $BaTiO_3$ may be added. $BaTiO_3$ is a ferroelectric material with a relatively high dielectric constant (e.g., a value of between approximately 500 and approximately 7000) and polarization and may be used in various electroactive devices described herein. Besides large polarizability and permittivity, large strains may also be achievable with $BaTiO_3$. Pure $BaTiO_3$ is an insulator whereas upon doping it may transform into a semiconductor in conjunction with the polymer material. In some embodiments, the particles of the materials having high dielectric constant may be included in the polymer to modify a mechanical (e.g., a Poisson's ratio) or electrical property (resistance, capacitance, etc.) of the first electroactive element or the second electroactive element.

In some embodiments, an electroactive device includes a first electrode, a second electrode and a voided polymer layer interposed between at least a portion of the area of the first and second electrode. In some embodiments, the voided polymer layer has no periodic structure on length scales greater than 10 nm and the voids have a characteristic length scale that is less than 1 micron. Voids may form a connected structure in an open cell configuration, or the voids may be surrounded, for example, by dielectric material in a closed cell configuration. In some embodiments, a voided dielectric material may further include particles of a material with a high dielectric constant, such as a solid such as barium titanite. In some embodiments, voids may be filled with a fluid, such as a liquid or a gas, for example a dielectric liquid or a dielectric gas with high dielectric strength gas, such as a halide, in particular a fluoride such as is sulfur hexafluoride, organofluoride or the like.

Electrodes

In some embodiments, an "electrode," as used herein, may refer to a conductive material, which may be in the form of a film or a layer. The electrode may be self-healing, such that when an area of an active layer (e.g., an electroactive element) shorts out, the electrode may be able to isolate the damaged area.

In some embodiments, the electrodes (e.g., such as a first electrode, a second electrode, or any other electrode) may include a metal such as aluminum, gold, silver, tin, copper, indium, gallium, zinc, and the like. An electrode may include one or more electrically conductive materials, such as a metal, a semiconductor (such as a doped semiconductor), carbon nanotube, graphene, transparent conductive oxides (TCOs, e.g., indium tin oxide (ITO), zinc oxide (ZnO), etc.), or other electrically conducting material.

In some embodiments, electroactive devices may include paired electrodes, which allow the creation of the electrostatic field that forces constriction of the electroactive polymer. Such electrodes may include relatively thin, electrically conductive layers or elements and may be of a non-compliant or compliant nature. Any suitable materials may be utilized in the electrodes, including electrically conductive materials suitable for use in thin-film electrodes, such as, for example, aluminum, transparent conductive oxides, silver, indium, gallium, zinc, carbon nanotubes, carbon black, and/or any other suitable materials formed by vacuum deposition, spray, adhesion, and/or any other suitable technique either on a non-electroactive polymer layer or directly on the electroactive polymer surface itself. In some embodiments, the electrode or electrode layer may be self-healing, such that damage from local shorting of a circuit can be isolated. Suitable self-healing electrodes may include thin films of metals, such as, for example, aluminum.

In some embodiments, one or more electrodes may be optionally electrically interconnected, for example, through a contact layer, to a common electrode. In some embodiments, an electroactive device may have a first common electrode, connected to a first plurality of electrodes, and a second common electrode, connected to a second plurality of electrodes. In some embodiments, electrodes (e.g., one of a first plurality of electrodes and one of a second plurality of electrodes) may be electrically isolated from each other using an insulator, such as a dielectric layer. An insulator may include a material without appreciable electrical conductivity, and may include a dielectric material, such as, for example, an acrylate or silicone polymer. In some embodiments, an electrode (or other electrical connector) may include a metal (e.g., tin, aluminum, copper, gold, silver, and the like). In some embodiments, an electrode (such as an electrical contact) or an electrical connector may include a similar material to other similar components.

In some embodiments, a first electrode may overlap (e.g., overlap in a parallel direction) at least a portion of a second electrode. The first and second electrode may be generally parallel and spaced apart. A third electrode may overlap at least a portion of either the first or second electrode. An electroactive element may include a first polymer (e.g., an elastomer material) and may be disposed between a first pair of electrodes (e.g., the first electrode and the second electrode). A second electroactive element, if used, may include a second elastomer material and may be disposed between second a pair of electrodes. In some embodiments, there may be an electrode that is common to both the first pair of electrodes and the second pair of electrodes.

In some embodiments, a common electrode may be electrically coupled (e.g., electrically contacted at an interface having a low contact resistance) to one or more other electrode(s), e.g., a second electrode and a third electrode located either side of a first electrode. In some embodiments, an electroactive device may include additional electroactive elements interleaved between electrodes, for example in a stacked configuration. For example, electrodes may form an interdigitated stack of electrodes, with alternate electrodes connected to a first common electrode and the remaining alternate electrodes connected to a second common electrode. For example, an additional electroactive element may be disposed on the other side of a first electrode. The additional electroactive element may overlap a first electroactive element. An additional electrode may be disposed abutting a surface of any additional electroactive element. In some embodiments, an electroactive device may include more (e.g., two, three, or more) such additional electroactive elements and corresponding electrodes. For example, an electroactive device may include a stack of two or more electroactive elements and corresponding electrodes. For example, an electroactive device may include between 2 electroactive elements to approximately 5, approximately 10, approximately 20, approximately 30, approximately 40, approximately 50, approximately 100, approximately 200, approximately 300, approximately 400, approximately 500, approximately 600, approximately 700, approximately 800, approximately 900, approximately 1000, approximately 2000, or greater than approximately 2000 electroactive elements.

In some embodiments, electrodes may be flexible and/or resilient and may stretch, for example elastically, when an electroactive element undergoes deformation. Electrodes may include one or more transparent conducting oxides (TCOs) such as indium oxide, tin oxide, indium tin oxide (ITO) and the like, graphene, carbon nanotubes, and the like. In other embodiments, for example, embodiments where electroactive devices have electroactive elements including nanovoided electroactive polymer materials, relatively rigid electrodes (e.g., electrodes including a metal such as aluminum) may be used.

In some embodiments, an electrode (e.g., the first and/or second electrode, or any other electrode) may have an electrode thickness of approximately 1 nm to approximately 100 nm, with an example thickness of approximately 10 nm to approximately 50 nm. In some embodiments, an electrode may be designed to allow healing of electrical breakdown (e.g., the electric breakdown of elastomeric polymer materials) of an electroactive element. In some embodiments, an electrode may have an electrode thickness of approximately 20 nm. In some embodiments, a common electrode may have a sloped shape, or may be a more complex shape (e.g., patterned or freeform). In some embodiments, a common electrode may be shaped to allow compression and expansion of an electroactive device during operation.

Electrode Fabrication

In some embodiments, the electrodes described herein (e.g., the first electrode, the second electrode, or any other electrode including any common electrode) may be fabricated using any suitable process. For example, electrodes may be fabricated using physical vapor deposition (PVD), chemical vapor deposition (CVD), sputtering, spray-coating, spin-coating, atomic layer deposition (ALD), and the like. In some embodiments, an electrode may be manufactured using a thermal evaporator, a sputtering system, a spray coater, a spin-coater, an ALD unit, and the like. In some embodiments, an electroactive element may be deposited directly on to an electrode. In some embodiments, an electrode may be deposited directly on to the electroactive element. In some embodiments, electrodes may be prefabricated and attached to an electroactive element. In some embodiments, an electrode may be deposited on a substrate, for example a glass substrate or flexible polymer film. In some embodiments, an electroactive element may directly abut an electrode. In some embodiments, there may be a dielectric layer, such as an insulating layer, between an electroactive element and an electrode. Any suitable combination of processes may be used.

Lens Assembly and Optical Systems

In some embodiments, the electroactive devices described herein may include or be mechanically coupled to one or more optical elements. An optical element may include a lens, mirror, prism, holographic element, beam splitter, optical filter, diffraction grating, or other optical element. In some embodiments, an electroactive device, such as an actuator, may include or be mechanically coupled to an adjustable lens. An adjustable lens may include any suitable type of lens with adjustable optical properties (e.g., adjustable optical power/focal length, correcting for wave-front distortion and/or aberrations, etc.), a liquid lens, a gel lens, or other adjustable lens. For example, an adjustable lens may include a deformable exterior layer filled with an optical medium such as a liquid or a semi-solid material (e.g., a gel, a semi-solid polymer, etc.). An adjustable lens may include one or more substantially transparent materials (at wavelengths of application) that may deform and/or flow under pressure.

A deformable optical element may include a substantially transparent and elastic material. For example, a deformable optical element may include a natural or synthetic elastomer that returns to a resting state when a deforming force is removed. In some embodiments, a deformable optical element may be deformed using an electroactive device generating a directly-driven force to produce a desired optical power or other optical property, e.g., for a lens or other optical element. In some embodiments, actuation forces may be applied around a perimeter of a deformable lens and may be generally uniform or variable around the perimeter of a lens. In some embodiments, electroactive devices may be used to actuate deformable optical elements in optical assemblies (e.g., lens systems).

In some embodiments, an actuator may include a bender. In some embodiments, the term "bender," as used herein, may refer, without limitation, to an electrically-driven actuator based on a plate or beam design that converts in-plane contraction, via an applied electric field, into out-of-plane displacement. A bender or bending actuator may include an all-electroactive or composite material multilayer (e.g., including stacked layers) operated in a bimorph, unimorph, or multilayered monolith configuration. In some embodiments, the term "unimorph bender," as used herein, may refer, without limitation, to a beam or plate having an electroactive layer and an inactive layer, in which displacement results from contraction or expansion of the electroactive layer. In some embodiments, the term "bimorph bender," as used herein, may refer, without limitation, to a beam or plate having two electroactive layers, in which displacement results from expansion or contraction of one layer with alternate contraction or expansion of the second layer.

In some embodiments, the term "multilayer bender," as used herein, may refer, without limitation, to a multilayer of electroactive, electrode, and insulation layers integrated with alternating contracting and expanding electroactive layers into a monolithic bender. The piezoelectric layers in multilayer piezoelectric benders may enable high electric fields (and therefore high force and displacement) to occur at low voltages. Multilayer benders may include multiple thin piezoceramic layers, which may require lower voltages to achieve similar internal stress to bimorph and unimorph designs. Charge and voltage control in open or closed loops may also be implemented in multilayer benders, with some adjustment. In some embodiments, a control system for a multilayer bender may not require a high voltage power supply.

According to some embodiments, an actuator may be a frame-contoured ring bender and/or may include stacked or overlapping benders. Furthermore, actuator volume may be constrained to an edge region outside an optical aperture, which may include a perimeter volume of a lens, an optical element, an optical sub-assembly, etc. As noted, electroactive device(s) such as an actuator (or a set of actuators) may provide equal or varied force and displacement at discrete points or along a spatially-defined distribution at the perimeter of a lens.

In some embodiments, an electroactive device may include one or more direct-drive benders, that may include an electroactive element that is disposed between two electrodes. In such examples, methods of forming an electroactive device may involve forming electrodes and an electroactive polymer simultaneously (e.g., via coflowing, slot die coating, etc.).

In some embodiment, a lens assembly may include multiple deformable optical elements (e.g., multiple deformable lenses, such as liquid lenses), where the deformation is provided by one or more electroactive devices, in accordance with example embodiments of the disclosure.

Methods of Device Fabrication

Various fabrication methods are discussed herein. Properties of the electroactive element may be varied across its spatial extent by varying one or more process parameters, such as wavelength, intensity, substrate temperature, other process temperature, gas pressure, application of additional radiation, chemical concentration gradients, chemical composition variations (e.g., to control micelle size), or other process parameter. Non-uniform void size distributions may be obtained by varying the size of sacrificial regions within an electroactive element.

Methods of forming an electroactive device include forming electrodes and electroactive elements sequentially (e.g., via vapor deposition, coating, printing, etc.) or simultaneously (e.g., via co-flowing, co-extrusion, slot die coating, etc.). Alternatively, the electroactive elements may be deposited using initiated chemical vapor deposition (iCVD), where, for example, suitable monomers of the desired polymers may be used to form the desired coating. In some embodiments, monomers, oligomers, and/or prepolymers for forming the electroactive elements may optionally be mixed with a solvent and the solvent may be removed from the electroactive element during and/or following curing to form nanovoids within the electroactive element.

A method of fabricating an electroactive device may include depositing a curable material onto a first electrode, curing the deposited curable material to form an electroactive element (e.g., including a cured elastomer material) and depositing an electrically conductive material onto a surface of the electroactive element opposite the first electrode to form a second electrode. In some embodiments, the cured elastomer material may have a Poisson's ratio of approximately 0.35 or less. In some embodiments, a method may further include depositing an additional curable material onto a surface of the second electrode opposite the electroactive element, curing the deposited additional curable material to form a second electroactive element including a second cured elastomer material, and depositing an additional electrically conductive material onto a surface of the second electroactive element opposite the second electrode to form a third electrode.

In some embodiments, a method of fabricating an electroactive element may include vaporizing a curable material, or a precursor thereof, where depositing the curable material may include depositing the vaporized curable material onto the first electrode. In some embodiments, a method of fabricating an electroactive element may include printing the polymer or precursor thereof (such as a curable material) onto an electrode. In some embodiments, a method may also include combining a polymer precursor material with at least one other component to form a deposition mixture. In some embodiments, a method may include combining a curable material with particles of a material having a high dielectric constant to form a deposition mixture.

According to some embodiments, a method may include positioning a curable material between a first electrically conductive material and a second electrically conductive material. The positioned curable material may be cured to form an electroactive element including a cured elastomer material. In some embodiments, the cured elastomer material may have a Poisson's ratio of approximately 0.35 or less. In some embodiments, at least one of the first electrically conductive material or the second electrically conductive material may include a curable electrically conductive material, and the method may further include curing the at least one of the first electrically conductive material or the second electrically conductive material to form an electrode. In this example, curing the at least one of the first electrically conductive material or the second electrically conductive material may include curing the at least one of the first electrically conductive material or the second electrically conductive material during curing of the positioned curable material.

In some embodiments, a curable material and at least one of a first electrically conductive material or a second electrically conductive material may be flowable during positioning of the curable material between the first and second electrodes. A method of fabricating an electroactive device may further include flowing a curable material and at least one of the first electrically conductive material or the second electrically conductive material simultaneously onto a substrate.

In some embodiments, methods for fabricating an electroactive device (e.g., an actuator) may include masks (e.g., shadow masks) to control the patterns of deposited materials to form the electroactive device. In some embodiments, the electroactive device may be fabricated on a surface enclosed by a deposition chamber, which may be evacuated (e.g., using one or more mechanical vacuum pumps to a predetermined level such as 10-6 Torr or below). A deposition chamber may include a rigid material (e.g., steel, aluminum, brass, glass, acrylic, and the like). A surface used for deposition may include a rotating drum. In some embodiments, the rotation may generate centrifugal energy and cause the deposited material to spread more uniformly over any underlying sequentially deposited materials (e.g., electrodes, polymer elements, and the like) that are mechanically coupled to the surface. In some embodiments, the surface may be fixed and the deposition and curing systems may move relative to the surface, or both the surface, the deposition, and/or curing systems may be moving simultaneously.

In some embodiments, an electroactive device (e.g., an actuator, sensor, or the like) may be fabricated by: providing an electrically conductive layer (e.g., a first electrode) having a first surface; depositing (e.g., vapor depositing) a polymer (e.g., an electroactive polymer) or polymer precursor (such as a monomer) onto the electrode; as needed, forming a polymer such as an electroactive polymer from the polymer precursor (e.g., by curing or a similar process); and depositing another electrically conductive layer (e.g., a second electrode) onto the electroactive polymer. In some embodiments, the method may further include repeating one or more of the above to fabricate additional layers (e.g., second electroactive element, other electrodes, alternating stack of polymer layers and electrodes, and the like. An electroactive device may have a stacked configuration.

In some embodiments, an electroactive device may be fabricated by first depositing a first electrode, and then depositing a curable material (e.g., a monomer) on the first electrode (e.g., deposited using a vapor deposition process). In some embodiments, an inlet (not shown) to a deposition chamber may open and may input an appropriate monomer initiator for starting a chemical reaction. In some embodiments, "monomer," as used herein, may refer to a monomer that forms a given polymer (i.e., as part of an electroactive element). In other examples, polymerization of a polymer precursor (such as a monomer) may include exposure to electromagnetic radiation (e.g., visible, UV, x-ray or gamma radiation), exposure to other radiation (e.g., electron beams, ultrasound), heat, exposure to a chemical species (such as a catalyst, initiator, and the like, some combination thereof, and the like.

Deposited curable material may be cured with a source of radiation (e.g., electromagnetic radiation, such as UV and/or visible light) to form an electroactive element that includes a cured elastomer material, for example by photopolymerization. In some embodiments, a radiation source may include an energized array of filaments that may generate electromagnetic radiation, a semiconductor device such as light-emitting diode (LED) or semiconductor laser, other laser, fluorescence or an optical harmonic generation source, and the like. A monomer and an initiator (if used) may react upon exposure to radiation to form an electroactive element. In some embodiments, radiation may include radiation having an energy (e.g., intensity and/or photon energy) capable of breaking covalent bonds in a material. Radiation examples may include electrons, electron beams, ions (such as protons, nuclei, and ionized atoms), x-rays, gamma rays, ultraviolet visible light, or other radiation, e.g., having appropriately high energy levels. In some embodiments, the cured elastomer material may include at least one non-polymeric component in a plurality of defined regions and the method may further include removing at least a portion of the at least one non-polymeric component from the cured elastomer material to form a voided (e.g., nanovoided) polymer element.

An electrically conductive material may then be deposited onto a surface of the first electroactive element opposite a first electrode to form a second electrode. An additional curable material may be deposited onto a surface of the second electrode opposite the electroactive element. For example, the deposited additional curable material may be cured to form a second electroactive element, for example including a second cured elastomer material. In some embodiments, an additional electrically conductive material may be deposited onto a surface of the second electroactive element opposite the second electrode to form a third electrode.

In some embodiments, a deposition chamber may have an exhaust port configured to open to release at least a portion of the vapor in the chamber during and/or between one or more depositions of the materials (e.g., monomers, oligomers, monomer initiators, conductive materials, etc.). In some embodiments, a deposition chamber may be purged (e.g., with a gas or the application of a vacuum, or both) to remove a portion of the vapor (e.g., monomers, oligomers, monomer initiators, metal particles, and any resultant by-products). Thereafter, one or more of the previous steps may be repeated (e.g., for a second electroactive element, and the like). In this way, individual layers of an electroactive device may be maintained at high purity levels.

In some embodiments, the deposition of the materials (e.g., monomers, oligomers, monomer initiators, conductive materials, etc.) of the electroactive device may be performed using a deposition process, such as chemical vapor deposition (CVD), to be described further below. CVD may refer to a vacuum deposition method used to produce high-quality, high-performance, solid materials. In CVD, a substrate may be exposed to one or more precursors, which may react and/or decompose on the substrate surface to produce the desired deposit (e.g., one or more electrodes, electroactive polymers, etc.). Frequently, volatile by-products are also produced, which may be removed by gas flow through the chamber.

In some embodiments, an electroactive device may be fabricated using an atmospheric pressure CVD (APCVD) coating formation technique (e.g., CVD at atmospheric pressure). In some embodiments, an electroactive device may be fabricated using a low-pressure CVD (LPCVD) process (e.g., CVD at sub-atmospheric pressures). In some embodiments, LPCVD may make use of reduced pressures that may reduce unwanted gas-phase reactions and improve the deposited material's uniformity across the substrate. In one aspect, a fabrication apparatus may apply an ultrahigh vacuum CVD (UHVCVD) process (e.g., CVD at very low pressure, typically below approximately $10^{-6}$ Pa (equivalently, approximately $10^{-8}$ torr)).

In some embodiments, an electroactive device may be fabricated using an aerosol assisted CVD (AACVD) process (e.g., a CVD in which the precursors are transported to the electroactive device) by means of a liquid/gas aerosol, which may be generated ultrasonically or with electrospray. In some embodiments, AACVD may be used with non-volatile precursors. In some embodiments, an electroactive device may be fabricated using a direct liquid injection CVD (DLICVD) process (e.g., a CVD in which the precursors are in liquid form, for example, a liquid or solid dissolved in a solvent). Liquid solutions may be injected in a deposition chamber towards one or more injectors. The precursor vapors may then be transported to the electroactive device as in CVD. DLICVD may be used on liquid or solid precursors, and high growth rates for the deposited materials may be reached using this technique.

In some embodiments, an electroactive device may be fabricated using a hot wall CVD process (e.g., CVD in which the deposition chamber is heated by an external power source and the electroactive device is heated by radiation from the heated wall of the deposition chamber). In another aspect, an electroactive device may be fabricated using a cold wall CVD process (e.g., a CVD in which only the electroactive device is directly heated, for example, by induction, while the walls of the chamber are maintained at room temperature).

In some embodiments, an electroactive device may be fabricated using a microwave plasma-assisted CVD (MPCVD) process, where microwaves are used to enhance chemical reaction rates of the precursors. In another aspect, an electroactive device may be fabricated using a plasma-enhanced CVD (PECVD) process (e.g., CVD that uses plasma to enhance chemical reaction rates of the precursors). In some embodiments, PECVD processing may allow deposition of materials at lower temperatures, which may be useful in withstanding damage to the electroactive device or in depositing certain materials (e.g., organic materials and/or some polymers).

In some embodiments, an electroactive device may be fabricated using a remote plasma-enhanced CVD (RPECVD) process. In some embodiments, RPECVD may be similar to PECVD except that the electroactive device may not be directly in the plasma discharge region. In some embodiments, the removal of the electroactive device from the plasma region may allow for the reduction of processing temperatures down to room temperature.

In some embodiments, an electroactive device may be fabricated using an atomic-layer CVD (ALCVD) process. In some embodiments, ALCVD may deposit successive layers of different substances to produce layered, crystalline film coatings on the electroactive device.

In some embodiments, an electroactive device may be fabricated using a combustion chemical vapor deposition (CCVD) process. In some embodiments, CCVD (also referred to as flame pyrolysis) may refer to an open-atmosphere, flame-based technique for depositing high-quality thin films (e.g., layers of material ranging from fractions of a nanometer (monolayer) to several micrometers in thickness) and nanomaterials, which may be used in forming the electroactive device.

In some embodiments, an electroactive device may be fabricated using a hot filament CVD (HFCVD) process, which may also be referred to as catalytic CVD (cat-CVD) or initiated CVD (iCVD). In some embodiments, this process may use a hot filament to chemically decompose the source gases to form the materials of the electroactive device. Moreover, the filament temperature and temperature of portions of the electroactive device may be independently controlled, allowing colder temperatures for better adsorption rates at the electroactive device, and higher temperatures necessary for decomposition of precursors to free radicals at the filament.

In some embodiments, an electroactive device may be fabricated using a hybrid physical-chemical vapor deposition (HPCVD) process. HPCVD may involve both chemical decomposition of precursor gas and vaporization of a solid source to form the materials on the electroactive device.

In some embodiments, an electroactive device may be fabricated using metalorganic chemical vapor deposition (MOCVD) process (e.g., a CVD that uses metalorganic precursors) to form materials on the electroactive device. For example, an electrode may be formed on an electroactive element using this approach.

In some embodiments, an electroactive device may be fabricated using a rapid thermal CVD (RTCVD) process. This CVD process uses heating lamps or other methods to rapidly heat the electroactive device. Heating only the electroactive device rather than the precursors or chamber walls may reduce unwanted gas-phase reactions that may lead to particle formation in the electroactive device.

In some embodiments, an electroactive device may be fabricated using a photo-initiated CVD (PICVD) process. This process may use UV light to stimulate chemical reactions in the precursor materials used to make the materials for the electroactive device. Under certain conditions, PICVD may be operated at or near atmospheric pressure.

In some embodiments, electroactive devices may be fabricated by nanovoided a process including depositing a curable material (e.g., a monomer such as an acrylate or a silicone) and a solvent for the curable material onto a substrate, heating the curable material with at least a portion of the solvent remaining with the cured monomer, and removing the solvent from the cured monomer. Using this process, voids such as nanovoids may be formed in the electroactive element. In some embodiments, a flowable material (e.g., a solvent) may be combined with the curable materials (e.g., monomers and conductive materials) to create a flowable mixture that may be used for producing electroactive polymers with nanovoids. The monomers may be monofunctional or polyfunctional, or mixtures thereof. Polyfunctional monomers may be used as crosslinking agents to add rigidity or to form elastomers. Polyfunctional monomers may include difunctional materials such as bisphenol fluorene (EO) diacrylate, trifunctional materials such as trimethylolpropane triacrylate (TMPTA), and/or higher functional materials. Other types of monomers may be used, including, for example, isocyanates, and these may be mixed with monomers with different curing mechanisms.

In some embodiments, the flowable material may be combined (e.g., mixed) with a curable material (e.g., a monomer). In some embodiments, a curable material may be combined with at least one non-curable component (e.g., particles of a material having a high dielectric constant) to form a mixture including the curable material and the at least one non-curable component, for example, on an electrode (e.g., a first electrode or a second electrode) of the electroactive device. Alternatively, the flowable material (e.g., solvent) may be introduced into a vaporizer to deposit (e.g., via vaporization or, in alternative embodiments, via printing) a curable material onto an electrode. In some embodiments, a flowable material (e.g., solvent) may be deposited as a separate layer either on top or below a curable material (e.g., a monomer) and the solvent and curable material may be allowed to diffuse into each other before being cured by the source of radiation to generate an electroactive polymer having nanovoids. In some embodiments, after the curable material is cured, the solvent may be allowed to evaporate before another electroactive polymer or another electrode is formed. In some embodiments, the evaporation of the solvent may be accelerated by the application of heat to the surface with a heater, which may, for example, by disposed within a drum forming surface and/or any other suitable location, or by reducing the pressure of the solvent above the substrate using a cold trap (e.g., a device that condenses vapors into a liquid or solid), or a combination thereof. Isolators (not shown) may be added to the apparatus to prevent, for example, the solvent vapor from interfering with the radiation source or the electrode source.

In some embodiments, the solvent may have a vapor pressure that is similar to at least one of the monomers being evaporated. The solvent may dissolve both the monomer and the generated electroactive polymer, or the solvent may dissolve only the monomer. Alternatively, the solvent may have low solubility for the monomer, or plurality of monomers if there is a mixture of monomers being applied. Furthermore, the solvent may be immiscible with at least one of the monomers and may at least partially phase separate when condensed on the substrate.

In some embodiments, there may be multiple vaporizers, with each of the multiple vaporizers applying a different material, including solvents, non-solvents, monomers, and/or ceramic precursors such as tetraethyl orthosilicate and water, and optionally a catalyst for forming a sol-gel such as HCl or ammonia.

In some embodiments, a method of generating a nanovoided polymer for use in connection with an electroactive device (such as electroactive devices described variously herein) may include co-depositing a monomer or mixture of monomers, a surfactant, and a nonsolvent material associated with the monomer(s) which is compatible with the surfactant. In various examples, the monomer(s) may include, but not be limited to, ethyl acrylate, butyl acrylate, octyl acrylate, ethoxy ethyl acrylate, 2-chloroethyl vinyl ether, chloromethyl acrylate, methacrylic acid, allyl glycidyl ether, and/or N-methylol acrylamide. Other curing agents such as polyamines, higher fatty acids or their esters, and/or sulfur may be used as the monomer(s). In some aspects, the surfactant may be ionic or non-ionic (e.g., SPAN 80, available from Sigma-Aldrich Company). In another aspect, the non-solvent material may include organic and/or inorganic non-solvent materials. For instance, the non-solvent material may include water or a hydrocarbon or may include a highly polar organic compound such as ethylene glycol. As noted, the monomer or monomers, non-solvent, and surfactant may be co-deposited. Alternatively, the monomer or monomers, non-solvent, and/or surfactant may be deposited sequentially. In one aspect, a substrate temperature may be controlled to generate and control one or more properties of the resulting emulsion generated by co-depositing or sequentially depositing the monomer or monomers, non-solvent, and surfactant. The substrate may be treated to prevent destabilization of the emulsion. For example, an aluminum layer may be coated with a thin polymer layer made by depositing a monomer followed by curing the monomer.

As discussed throughout the instant disclosure, the disclosed devices, systems, and methods may provide one or more advantages over conventional devices, systems, and methods. For example, in contrast to prior devices, the electroactive devices presented herein may include electroactive elements that achieve substantially uniform strain in the presence of an electrostatic field produced by a potential difference between paired electrodes, permitting the electroactive devices to achieve, for example, improvements in both energy density and specific power density. Such uniform strain may reduce or eliminate unwanted deformations in the electroactive elements and may result in greater overall deformation, such as compression, of the electroactive elements, providing a greater degree of movement of surface regions of the electroactive elements while requiring a lower amount of energy to provide such deformation. The electroactive elements may include polymer materials having nanovoided regions that allow for additional compression in the presence of a voltage gradient in comparison to non-voided materials. Additionally, an electroactive device may be formed in a stacked structure having a plurality of electroactive elements that are layered with multiple electrodes, enabling the plurality of electroactive elements to be actuated in conjunction with each other in a single device that may undergo a more substantial degree of deformation (e.g., compression and/or expansion) in comparison to an electroactive device having a single electroactive element or layer.

Electroactive devices described and shown herein may be utilized in any suitable technologies, without limitation. For example, such electroactive devices may be utilized as mechanical actuators to actuate movement of adjacent components. In at least one embodiment, the disclosed electroactive devices may be incorporated into optical systems such as adjustable lenses (e.g., fluid-filled lenses) to actuate movement of one or more optical layers. Such actuation may, for example, allow for selected movement of lens layers of an adjustable lens, resulting in deformation of the lens layers to adjust optical characteristics (e.g., focal point, spherical correction, cylindrical correction, axial correction, etc.) of the adjustable lens. In some embodiments, electroactive devices as disclosed herein may be utilized as actuators in micromechanical apparatuses, such as microelectromechanical devices. Additionally or alternatively, electroactive devices may be used for converting mechanical energy to electrical energy for use in energy harvesting systems and/or sensor apparatuses.

As detailed above, the computing devices and systems described and/or illustrated herein broadly represent any type or form of computing device or system capable of executing computer-readable instructions, such as those contained within the modules described herein. In their most basic configuration, these computing device(s) may each include at least one memory device and at least one physical processor.

In some examples, the term "memory device" generally refers to any type or form of volatile or non-volatile storage device or medium capable of storing data and/or computer-readable instructions. In one example, a memory device may store, load, and/or maintain one or more of the modules described herein. Examples of memory devices include, without limitation, Random Access Memory (RAM), Read Only Memory (ROM), flash memory, Hard Disk Drives (HDDs), Solid-State Drives (SSDs), optical disk drives, caches, variations or combinations of one or more of the same, or any other suitable storage memory.

In some examples, the term "physical processor" generally refers to any type or form of hardware-implemented processing unit capable of interpreting and/or executing computer-readable instructions. In one example, a physical processor may access and/or modify one or more modules stored in the above-described memory device. Examples of physical processors include, without limitation, microprocessors, microcontrollers, Central Processing Units (CPUs), Field-Programmable Gate Arrays (FPGAs) that implement softcore processors, Application-Specific Integrated Circuits (ASICs), portions of one or more of the same, variations or combinations of one or more of the same, or any other suitable physical processor.

Although illustrated as separate elements, the modules described and/or illustrated herein may represent portions of a single module or application. In addition, in certain embodiments one or more of these modules may represent one or more software applications or programs that, when executed by a computing device, may cause the computing device to perform one or more tasks. For example, one or more of the modules described and/or illustrated herein may represent modules stored and configured to run on one or more of the computing devices or systems described and/or illustrated herein. One or more of these modules may also represent all or portions of one or more special-purpose computers configured to perform one or more tasks.

In some embodiments, the term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives, tape drives, and floppy disks), optical-storage media (e.g., Compact Disks (CDs), Digital Video Disks (DVDs), and BLU-RAY disks), electronic-storage media (e.g., solid-state drives and flash media), and other distribution systems.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A device comprising:
a multilayer structure having a uniform thickness;
a first electrode;
a second electrode; and
a control circuit,
wherein:
the multilayer structure is located at least in part between the first electrode and the second electrode;
the multilayer structure includes:
a nanovoided polymer layer; and
a solid layer;
the solid layer is a non-nanovoided layer having a void fraction of less than 5%;
the solid layer is an electrical insulator layer; and
the control circuit is configured to apply an electrical signal between the first electrode and the second electrode to induce an actuation of the device resulting from a mechanical deformation of the nanovoided polymer layer.

2. The device of claim 1, wherein the nanovoided polymer layer is an electroactive layer.

3. The device of claim 1, wherein the nanovoided layer has a void fraction of at least 30% by volume.

4. The device of claim 1, wherein the solid layer comprises a polymer.

5. The device of claim 4, wherein the nanovoided polymer layer comprises the polymer.

6. The device of claim 1, wherein the solid layer is an inorganic layer.

7. The device of claim 6, wherein the solid layer comprises an inorganic oxide.

8. The device of claim 1, wherein the solid layer comprises a dielectric polymer.

9. The device of claim 1, wherein the solid layer and the nanovoided polymer layer both comprise a fluoropolymer.

10. The device of claim 1, wherein the nanovoided polymer layer has first dielectric breakdown voltage, and the solid layer has a second dielectric breakdown voltage, and the first dielectric breakdown voltage is higher than the second dielectric breakdown voltage.

11. The device of claim 1, wherein the device is an actuator.

12. A device comprising:
a first electrode;
a second electrode;
a control circuit; and
a multilayer structure, wherein:
the multilayer structure includes a nanovoided polymer layer and a solid layer;
the nanovoided polymer layer comprises an electroactive polymer;
the solid layer is a non-nanovoided layer having a void fraction of less than 5%;
the solid layer is an electrical insulator layer;
the multilayer structure has a uniform thickness and is located at least in part between the first electrode and the second electrode; and
the control circuit is configured to apply an electrical signal between the first electrode and the second electrode to induce an actuation of the device resulting from a mechanical deformation of the multilayer structure.

13. The device of claim 12, wherein application of the electrical signal between the first electrode and the second electrode induces the mechanical deformation of the multilayer structure due to a constriction of the nanovoided polymer layer.

14. The device of claim 12, wherein the device is an actuator.

15. The device of claim 12, wherein
the multilayer structure comprises a first layer, a second layer, and a third layer,
wherein the second layer is located between the first layer and the third layer, and
wherein at least one layer is the nanovoided polymer layer.

16. The device of claim 15, wherein the second layer is the nanovoided polymer layer, and the first and third layers are both solid polymer layers.

17. The device of claim 12, wherein the solid layer comprises a polymer.

18. The device of claim 12, wherein the solid layer comprises a dielectric polymer.

19. The device of claim 12, wherein the solid layer is an inorganic layer.

* * * * *